(12) United States Patent
Harumoto et al.

(10) Patent No.: US 12,288,769 B2
(45) Date of Patent: Apr. 29, 2025

(54) MICRO-LED MOUNTING SUBSTRATE, MICRO-LED DISPLAY, AND METHOD OF MANUFACTURING MICRO-LED MOUNTING SUBSTRATE

(71) Applicant: SHARP KABUSHIKI KAISHA, Sakai (JP)

(72) Inventors: Yoshiyuki Harumoto, Sakai (JP); Yoshito Hashimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 406 days.

(21) Appl. No.: 17/722,831

(22) Filed: Apr. 18, 2022

(65) Prior Publication Data
US 2022/0352118 A1    Nov. 3, 2022

(30) Foreign Application Priority Data

Apr. 30, 2021  (JP) .................................. 2021-077116

(51) Int. Cl.
*H01L 29/18*  (2006.01)
*H01L 23/00*  (2006.01)
*H01L 25/075* (2006.01)
*H10H 20/84*  (2025.01)
(Continued)

(52) U.S. Cl.
CPC .............. *H01L 24/95* (2013.01); *H01L 24/81* (2013.01); *H01L 25/0753* (2013.01); *H10H 20/84* (2025.01); *H10H 20/857* (2025.01); *H01L 24/16* (2013.01); *H01L 2224/16238* (2013.01); *H01L 2224/81141* (2013.01); *H01L 2224/81815* (2013.01); *H01L 2224/95136* (2013.01); *H10H 20/034* (2025.01); *H10H 20/0364* (2025.01)

(58) Field of Classification Search
CPC ..... H01L 24/95; H01L 24/81; H01L 25/0753; H01L 33/44; H01L 33/62; H01L 24/16; H01L 2224/16238; H01L 2224/81141; H01L 2224/81815; H01L 2224/95136; H01L 2933/0025; H01L 2933/0066; H01L 24/06
USPC ..................................................... 257/59, 72
See application file for complete search history.

(56) References Cited

U.S. PATENT DOCUMENTS 10,991,846 B2 *  4/2021  Ting ..................... H01L 33/0093

FOREIGN PATENT DOCUMENTS

WO        2020/116207 A1    6/2020

\* cited by examiner

*Primary Examiner* — Tan N Tran
(74) *Attorney, Agent, or Firm* — ScienBiziP, P.C.

(57) ABSTRACT

A micro-LED mounting substrate includes a wiring line substrate provided with at least a plurality of substrate-side connecting portions on one plate surface, a plurality of micro-LEDs disposed side by side in the one plate surface of the wiring line substrate and each including at least a light-emitting face and an LED-side connecting portion provided on a surface opposite to the light-emitting face and connected to the substrate-side connecting portion, a first positioning portion provided on at least a portion of the plurality of micro-LEDs, and facing an installation surface of the substrate-side connecting portion of the wiring line substrate, and a second positioning portion provided on the installation surface of the substrate-side connecting portion of the wiring line substrate and capable of positioning the micro-LEDs including the first positioning portion by being recess-projection-fitted to the first positioning portion.

8 Claims, 33 Drawing Sheets

(51) Int. Cl.
*H10H 20/857* (2025.01)
*H10H 20/01* (2025.01)

MICRO-LED MOUNTING SUBSTRATE, MICRO-LED DISPLAY, AND METHOD OF MANUFACTURING MICRO-LED MOUNTING SUBSTRATE

CROSS-REFERENCE TO RELATED APPLICATIONS

This application claims the benefit of priority to Japanese Patent Application Number 2021-077116 filed on Apr. 30, 2021. The entire contents of the above-identified application are hereby incorporated by reference.

BACKGROUND

Technical Field

The technique disclosed herein relates to a micro-LED mounting substrate, a micro-LED display, and a method of manufacturing the micro-LED mounting substrate.

As an example of a micro-LED mounting structure, the structure described in WO 2020/116207 is known. The micro-LED mounting structure described in WO 2020/116207 includes a wiring line substrate including electrode portions arranged according to a predetermined array on one side surface thereof, and micro-LEDs provided correspondingly to positions of the electrode portions, configured to emit light of a specified spectrum from the ultraviolet wavelength band to the blue wavelength band, including, on one surface of surfaces facing each other, electrodes electrically connected to the electrode portions, and including, on the other surface, a light radiation surface configured to radiate emitted light. The electrodes and the electrode portions are adhered via a first adhesive of a thermosetting type having electrical conductivity. All or a portion of a peripheral side surface of each of the micro-LEDs is enclosed and adhered by a second adhesive of a thermosetting type having electrical conductivity. The micro-LEDs are fixed to the wiring line substrate via the second adhesive.

SUMMARY

According to the micro-LED mounting structure described in WO 2020/116207, it is possible to reliably adhere and electrically connect the electrodes of the micro-LEDs and the electrode portions of the wiring line substrate and reliably connect the micro-LEDs and the wiring line substrate. Nevertheless, when a plurality of micro-LEDs arrayed on a wafer are mounted on a wiring line substrate and displacement of a micro-LED occurs, the electrodes of the displaced micro-LED may not successfully connect to the electrode portions on the wiring line substrate, resulting in a risk of connection failure of the micro-LED. Note that, in WO 2020/116207, the micro-LEDs are not positioned by each adhesive since the wafer and the wiring line substrate are bonded while each adhesive is maintained in the softest state.

The technique described herein has been made on the basis of circumstances such as described above, and an object thereof is to make a micro-LED less susceptible to connection defects.

(1) A micro-LED mounting substrate according to a technique described herein includes a wiring line substrate including a pair of main surfaces, and provided with at least a plurality of substrate-side connecting portions on one main surface of the pair of main surfaces, a plurality of micro-LEDs disposed side by side on the one main surface of the wiring line substrate and each including at least a light-emitting face and an LED-side connecting portion provided on a surface opposite to the light-emitting face and connected to the substrate-side connecting portion, a first positioning portion provided on at least a portion of the plurality of micro-LEDs, and facing an installation surface of the substrate-side connecting portion of the wiring line substrate, and a second positioning portion provided on the installation surface of the substrate-side connecting portion of the wiring line substrate and capable of positioning the micro-LEDs including the first positioning portion by being recess-projection-fitted to the first positioning portion.

(2) Further, in the micro-LED mounting substrate described above, in addition to (1) described above, the first positioning portion may be provided separately from the LED-side connecting portion, and the second positioning portion may be provided separately from the substrate-side connecting portion.

(3) Further, in the micro-LED mounting substrate described above, in addition to (2) described above, the first positioning portion may be disposed closer to an outer end of each of the micro-LEDs than the LED-side connecting portion.

(4) Further, in the micro-LED mounting substrate described above, in addition to (3) described above, the micro-LED may be a polygon having a planar shape with four or more sides, and at least two of the first positioning portions may be disposed at diagonal positions of each of the micro-LEDs.

(5) Further, in the micro-LED mounting substrate described above, in addition to (4) described above, the first positioning portion may be disposed at each corner position of the micro-LED.

(6) Further, in the micro-LED mounting substrate described above, in addition to (1) described above, the first positioning portion may be integrated with the LED-side connecting portion, and the second positioning portion may be integrated with the substrate-side connecting portion.

(7) Further, in the micro-LED mounting substrate described above, in addition to any one of (1) described above to (6) described above, the first positioning portion may be provided on each of the plurality of micro-LEDs while a plurality of the second positioning portions are respectively recess-projection-fitted to the plurality of first positioning portions provided on each of the plurality of micro-LEDs.

(8) Further, in the micro-LED mounting substrate described above, in addition to any one of (1) described above to (6) described above, the wiring line substrate may be a polygon having a planar shape with four or more sides, the plurality of micro-LEDs may be disposed side by side in a matrix shape on the one main surface of the wiring line substrate, and the first positioning portion may be selectively provided on a plurality of the micro-LEDs disposed at the corner positions of the wiring line substrate.

(9) Further, in the micro-LED mounting substrate described above, in addition to any one of (1) described above to (8) described above, the micro-LEDs may be provided with a plurality of the first positioning portions while the wiring line substrate may be provided with a plurality of the second positioning portions, and the plurality of first positioning portions and the plurality of second positioning portions may be configured to form a plurality of sets that can fit together when a combination thereof matches and cannot fit together when the combination does not match, and different sets may each be rotationally asymmetric with respect to a center of each of the micro-LEDs.

(10) Further, a micro-LED display according to a technique described herein includes the micro-LED mounting substrate according to any one of (1) described above to (9) described above, and a plurality of pixels serving as display units for displaying an image. The plurality of micro-LEDs constitute the plurality of pixels.

(11) Further, a method of manufacturing a micro-LED mounting substrate according to a technique described herein includes manufacturing a plurality of micro-LEDs including at least a light-emitting face and an LED-side connecting portion provided on a surface on a side opposite to the light-emitting face, manufacturing a wiring line substrate including a pair of main surfaces and provided with at least a plurality of substrate-side connecting portions on one main surface of the pair of main surfaces, and mounting, onto the wiring line substrate, the plurality of micro-LEDs side by side on the one main surface. The manufacturing of the plurality of micro-LEDs includes providing a first positioning portion on at least a portion of the plurality of micro-LEDs, the first positioning portion facing an installation surface of the substrate-side connecting portion of the wiring line substrate, and the manufacturing of a wiring line substrate includes providing a second positioning portion on the installation surface of the substrate-side connecting portion of the wiring line substrate, the second positioning portion being capable of positioning the micro-LEDs including the first positioning portion by being recess-projection-fitted to the first positioning portion.

(12) Further, in the method of manufacturing a micro-LED mounting substrate described above, in addition to (11) described above, the manufacturing of a plurality of micro-LEDs and the manufacturing of a wiring line substrate may include providing the first positioning portion and the second positioning portion by a photolithography method using a half-tone mask or a gray tone mask, respectively.

(13) Further, in the method of manufacturing a micro-LED mounting substrate described above, in addition to (11) described above or (12) described above, the manufacturing of the plurality of micro-LEDs may include providing the plurality of micro-LEDs side by side on one plate surface of a support substrate including a pair of the plate surfaces, and providing a first inter-substrate positioning portion on the one plate surface of the support substrate, and the manufacturing of a wiring line substrate may include providing, on the installation surface of the substrate-side connecting portion in the wiring line substrate, a second inter-substrate positioning portion capable of positioning the support substrate with respect to the wiring line substrate by being recess-projection-fitted to the first inter-substrate positioning portion.

(14) Further, in the method of manufacturing a micro-LED mounting substrate described above, in addition to (13) described above, the manufacturing of a wiring line substrate may include providing a circuit portion to be connected to the micro-LED on the one main surface of the wiring line substrate, and superimposing the second inter-substrate positioning portion on the circuit portion.

(15) Further, the method of manufacturing a micro-LED mounting substrate described above, in addition to (13) described above, may further include parting and removing an end portion of the wiring line substrate, the end portion being unnecessary, after the mounting of the plurality of micro-LEDs. The manufacturing of the wiring line substrate may include providing the second inter-substrate positioning portion on the end portion of the wiring line substrate removed in the parting and removing of an end portion.

According to the technique described herein, it is possible to reduce the susceptibility of a micro-LED to connection defects.

BRIEF DESCRIPTION OF DRAWINGS

The disclosure will be described with reference to the accompanying drawings, wherein like numbers reference like elements.

DESCRIPTION OF EMBODIMENTS

First Embodiment

A first embodiment will be described with reference to FIGS. 1 to 17. The present embodiment illustrates a micro-light-emitting diode (micro-LED) mounting substrate 11, a micro-LED display 10 including the micro-LED mounting substrate 11, and a method of manufacturing the micro-LED mounting substrate 11. Note that an X-axis, a Y-axis, and a Z-axis are illustrated in a part of each drawing, and each axial direction is illustrated to be the direction illustrated in each drawing.

Figure 1:
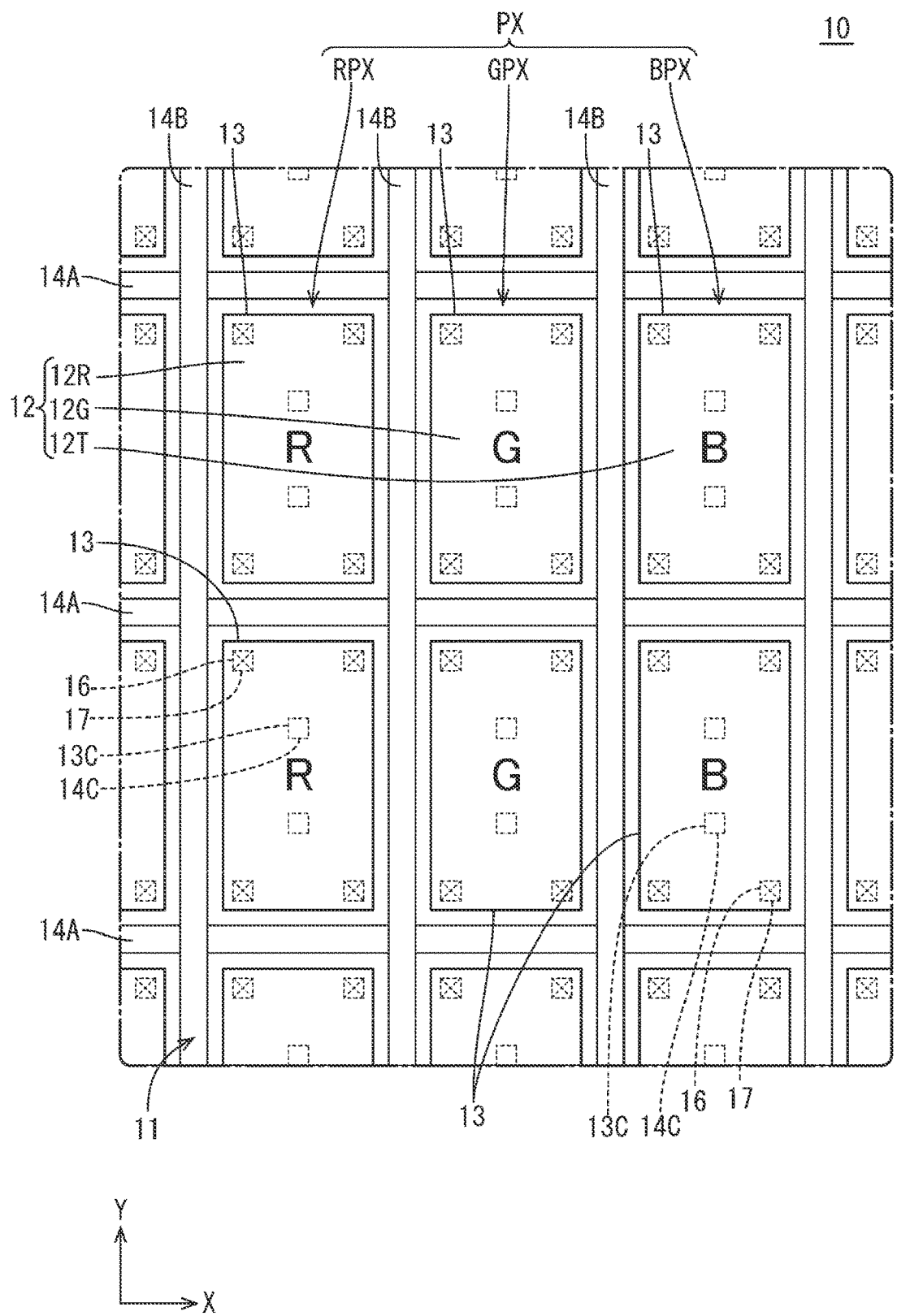
FIG. 1 is a schematic plan view illustrating an array of micro-LEDs in a micro-LED display according to a first embodiment.
Figure 2:
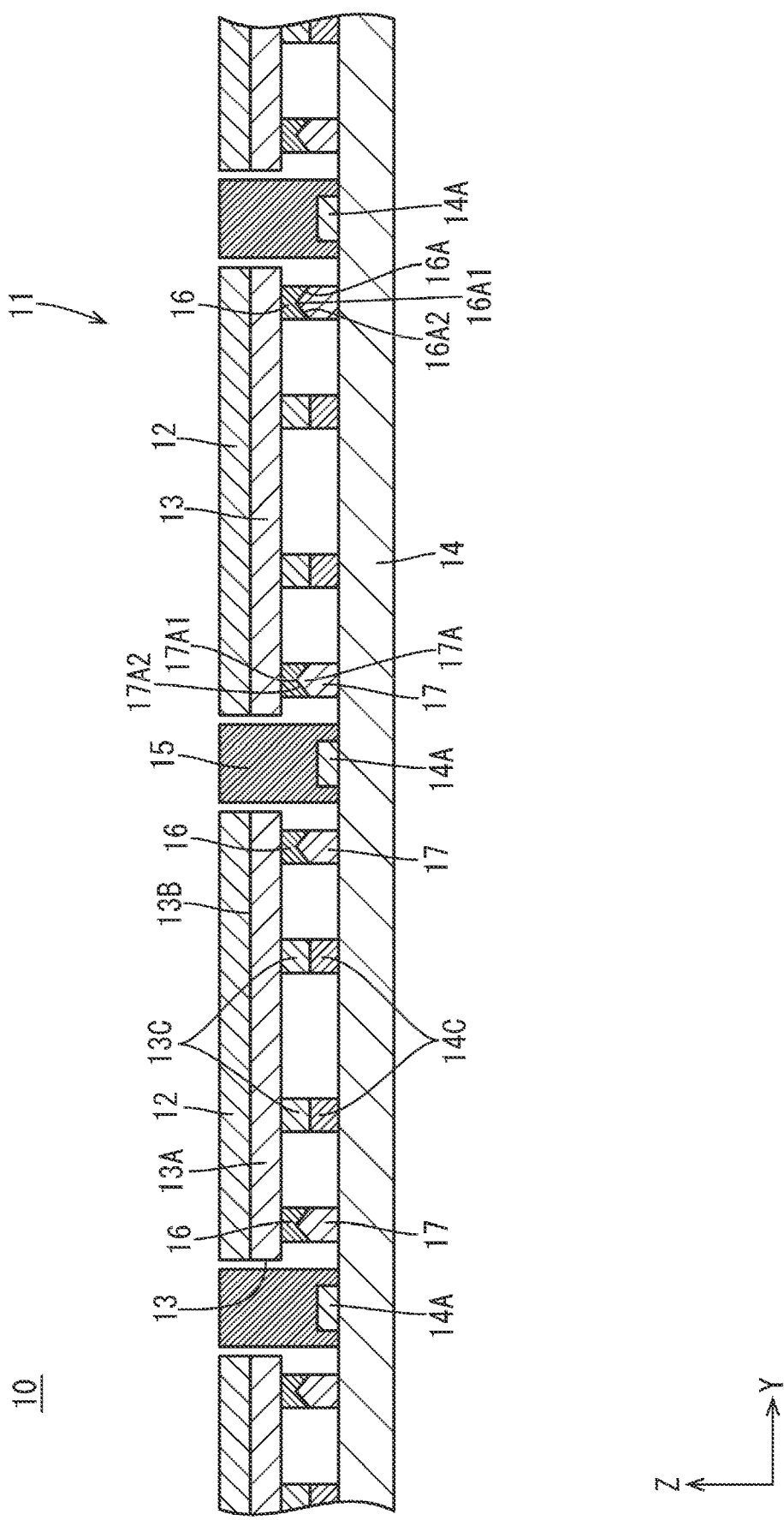
FIG. 2 is a cross-sectional view of the micro-LED display taken in a Y-axis direction.
Figure 3:
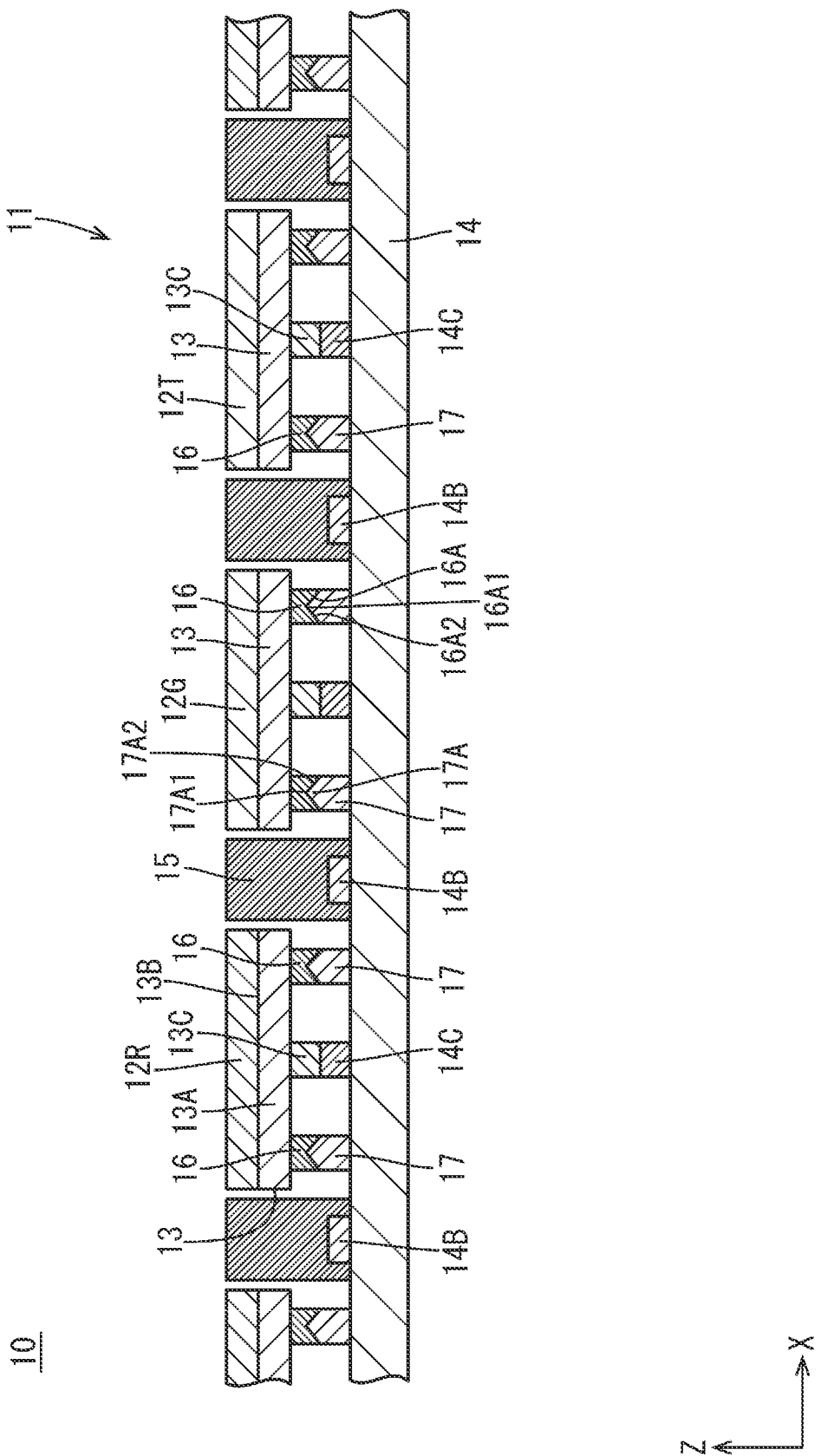
FIG. 3 is a cross-sectional view of the micro-LED display taken in an X-axis direction.

As illustrated in FIGS. 1 to 3, the micro-LED display 10 includes a display surface on which an image is displayed, and a plurality of pixels PX serving as display units are disposed side by side in a matrix shape in a plane of the display surface. The pixel PX includes three colors of a blue pixel BPX that exhibits blue (B), a green pixel GPX that exhibits green (G), and a red pixel RPX that exhibits red (R), and a display pixel capable of color display of a predetermined gray scale is configured by the pixels BPX, GPX, RPX of the three colors. Note that, in FIGS. 1 to 3, English initials (B, G, R) are used to indicate the display colors of each pixel PX.

The micro-LED display 10 includes the micro-LED mounting substrate 11 including a micro-LED 13 constituting the pixel PX and a wavelength conversion layer 12 capable of converting a wavelength of light emitted from the micro-LED 13. Note that the micro-LED display 10 may include a protective panel for the wavelength conversion layer 12 on a side opposite to the micro-LED mounting substrate 11 side.

The micro-LED mounting substrate 11 includes a plurality of the micro-LEDs 13 and a wiring line substrate (backplane) 14 onto which the plurality of micro-LEDs 13 are mounted. Each of the micro-LEDs 13 is manufactured using gallium nitride (GaN) as a main material, and includes a micro-LED chip 13A having a vertical structure in which an active layer (light-emitting layer) is interposed between a p-type semiconductor layer and an n-type semiconductor layer. The micro-LED chip 13A emits light of a single color included in a wavelength region belonging to blue (from approximately 380 nm to approximately 500 nm, for example), that is, blue light, according to a voltage being applied. Of the micro-LED chip 13A, a surface on a side opposite to the wiring line substrate 14 side is a light-emitting face 13B. On a surface on the wiring line substrate 14 side (opposite to the light-emitting face 13B) of the micro-LED chip 13A, an LED-side connecting portion 13C electrically connectable to a power supply circuit on the wiring line substrate 14 side is provided.

Figure 4:
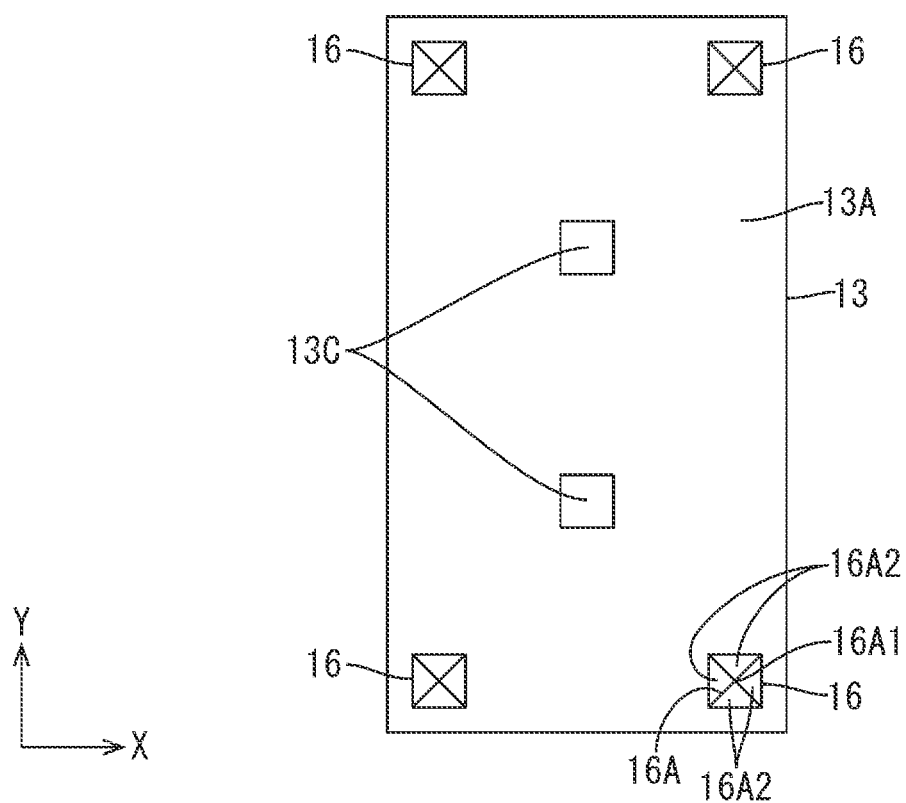
FIG. 4 is a bottom view of a micro-LED included in the micro-LED display.

The micro-LED 13, as illustrated in FIG. 4, has a vertically long rectangular shape in a plan view, and has a short-side direction, a long-side direction, and a thickness direction corresponding to the X-axis direction, the Y-axis direction, and the Z-axis direction, respectively. Both a short-side dimension and a long-side dimension of the micro-LED 13 are less than 100 μm, making the micro-LED 13 even smaller than a general mini LED. The LED-side connecting portion 13C is provided at two positions of the micro-LED 13, near a center position in the short-side direction and spaced apart in the long-side direction. Each LED-side connecting portion 13C is disposed closer to a center of the micro-LED 13 than an outer end position of the micro-LED 13 in the long-side direction. When power is supplied from a power supply circuit on the wiring line substrate 14 side to these two LED-side connecting portions 13C, blue light is emitted from the light-emitting face 13B of the micro-LED 13.

The wiring line substrate 14 is composed of silicon or the like and, as illustrated in FIGS. 1 to 3, is provided with at least a first wiring line 14A and a second wiring line 14B constituting the power supply circuit, and substrate-side connecting portions 14C connectable to the LED-side connecting portions 13C. The first wiring line 14A extends in the X-axis direction while the second wiring line 14B extends in the Y-axis direction, intersecting the first wiring line 14A. An insulating film for preventing short-circuiting of both the first wiring line 14A and the second wiring line 14B is interposed between intersecting areas of the first wiring line 14A and the second wiring line 14B. The substrate-side connecting portions 14C are composed of solder and are installed on an exposed portion of branch wiring lines branching from each of the wiring lines 14A, 14B. Accordingly, when the substrate-side connecting portions 14C are melted in a state of contact with the LED-side connecting portions 13C, the micro-LED 13 is mechanically fixed to the wiring line substrate 14, and the LED-side connecting portions 13C are electrically connected to the power supply circuit via the substrate-side connecting portions 14C.

Figure 5:
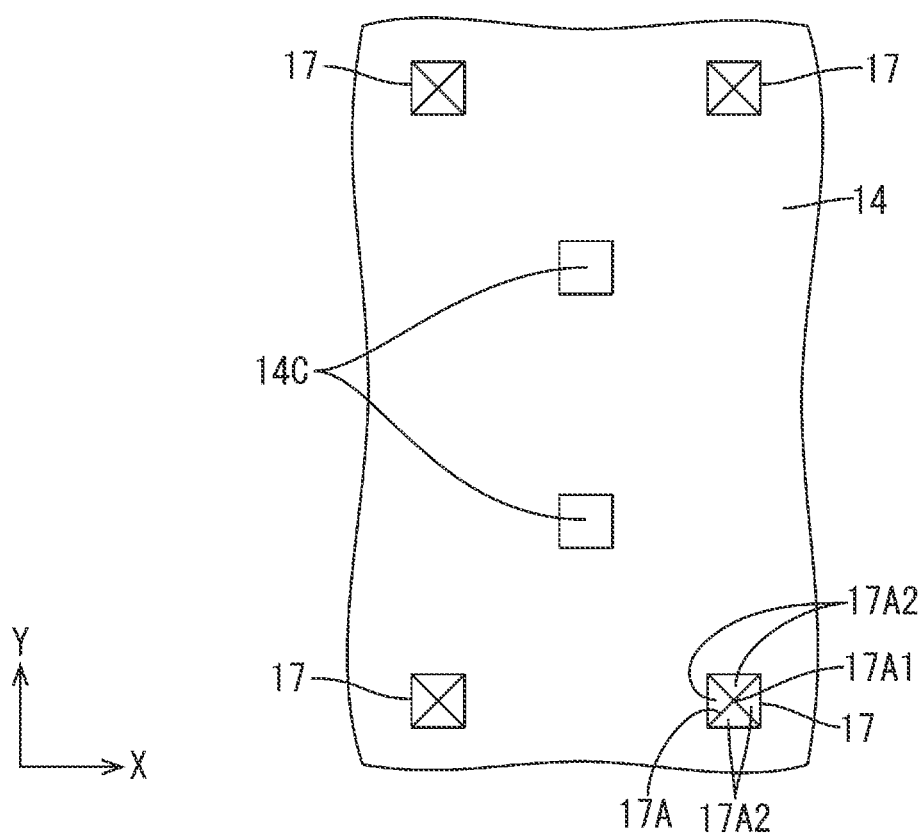
FIG. 5 is a plan view illustrating a mounting region of the micro-LED in a wiring line substrate included in the micro-LED display.

As illustrated in FIG. 5, two substrate-side connecting portions 14C are provided in each mounting region of each of the micro-LEDs 13 of the wiring line substrate 14. The two substrate-side connecting portions 14C are disposed at positions spaced apart in the Y-axis direction in each mounting region of each of the micro-LEDs 13. The interval between the two substrate-side connecting portions 14C is substantially the same as the interval between the two LED-side connecting portions 13C provided on the micro-LED 13.

As illustrated in FIGS. 2 and 3, the wiring line substrate 14 is provided with a light blocking portion 15 that partitions the pixels PX adjacent to each other. The light blocking portion 15 is superimposed on the first wiring line 14A and the second wiring line 14B, and has a lattice shape in a plan view. The light blocking portion 15 has a wall shape that rises from a mounting surface of the micro-LED 13 of the wiring line substrate 14, and blocks light attempting to move back and forth between adjacent pixels PX to ensure display independence of each pixel PX.

As illustrated in FIGS. 2 and 3, the wavelength conversion layer 12 is layered on the light-emitting face 13B of each of the micro-LEDs 13. The wavelength conversion layer 12 includes a green phosphor layer 12G layered on the micro-LED 13 constituting the green pixel GPX, a red phosphor layer 12R layered on the micro-LED 13 constituting the red pixel RPX, and a non-phosphor layer 12T layered on the micro-LED 13 constituting the blue pixel BPX. The green phosphor layer 12G includes green phosphor that uses blue light as excitation light and emits light in a wavelength region belonging to green (from approximately 500 nm to approximately 570 nm), that is, green light, as fluorescent light. Accordingly, when blue light is emitted from the light-emitting face 13B of the micro-LED 13 constituting the green pixel GPX, the blue light is wavelength-converted into green light by the green phosphor included in the green phosphor layer 12G and emitted. The red phosphor layer 12R includes red phosphor that uses blue light as excitation light and emits light in a wavelength region belonging to red (from approximately 600 nm to approximately 780 nm), that is, red light, as fluorescent light. Accordingly, when blue light is emitted from the light-emitting face 13B of the micro-LED 13 constituting the red pixel RPX, the blue light is wavelength-converted into red light by the red phosphor included in the red phosphor layer 12R and emitted. The non-phosphor layer 12T is colorless and transparent without containing phosphor, and is provided to match the heights of the other phosphor layers 12A, 12B. Accordingly, when blue light is emitted from the light-emitting face 13B of the micro-LED 13 constituting the blue pixel BPX, the blue light is emitted by passing through the non-phosphor layer 12T as is.

Figure 14:
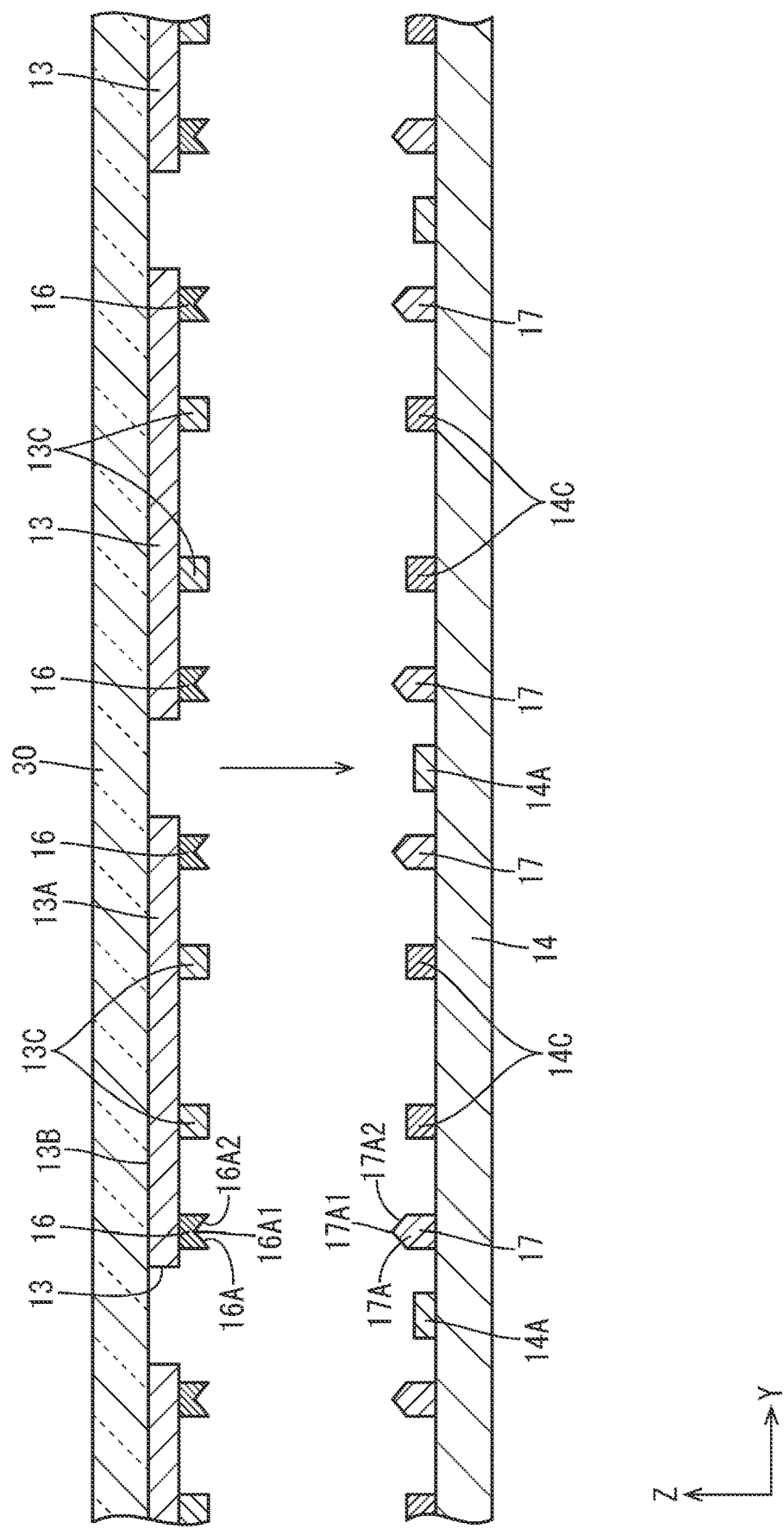
FIG. 14 is a cross-sectional view taken in the Y-axis direction illustrating a state before the support substrate is bonded to the wiring line substrate in a micro-LED mounting process included in the method of manufacturing a micro-LED mounting substrate.

When the micro-LED mounting substrate 11 having a configuration such as described above is manufactured, a plurality of micro-LEDs 13 are created on a plate surface of a support substrate 30 composed of sapphire or the like in advance, and the support substrate 30 is bonded to the wiring line substrate 14 separately manufactured (refer to FIG. 14). When the support substrate 30 is bonded to the wiring line substrate 14, an interface between the support substrate 30 and each of the micro-LEDs 13 is irradiated with laser light to peel off (laser lift off) each of the micro-LEDs 13. In this way, the micro-LEDs 13 are collectively mounted on the wiring line substrate 14. When this irradiation with laser light is performed or when bonding of both substrates 14, 30 is performed, vibration may occur, and this vibration may cause displacement of one of the micro-LEDs 13 peeled from the support substrate 30. When displacement of the micro-LED 13 occurs, there is a risk that the LED-side connecting portions 13C of the micro-LED 13 that is displaced are not successfully connected to the substrate-side connecting portion 14C on the wiring line substrate 14, causing connection failure of the micro-LED 13.

Thus, as illustrated in FIGS. 2 and 3, the micro-LED 13 according to the present embodiment is provided with first positioning portions 16 while the wiring line substrate 14 is provided with second positioning portions 17 capable of positioning the micro-LED 13 including the first positioning portion 16 by being recess-projection-fitted to the first positioning portions 16. The first positioning portions 16 are provided on a surface of the micro-LED chip 13A on a side opposite to the light-emitting face 13B (surface facing the wiring line substrate 14, mounting surface), and face an installation surface of the substrate-side connecting portions 14C of the wiring line substrate 14. The second positioning portions 17 are provided on the installation surface of the substrate-side connecting portions 14C of the wiring line substrate 14 (surface facing the micro-LED 13), and face the surface of the micro-LED 13 on the side opposite to the light-emitting face 13B.

According to such a configuration, when the plurality of micro-LEDs 13 are mounted on the wiring line substrate 14 and displacement of one of the micro-LEDs 13 occurs due to the influence of vibration or the like, the second positioning portions 17 are recess-projection-fitted to the first positioning portions 16 provided on the micro-LED 13, thereby correcting the displacement of the micro-LED 13. The LED-side connecting portions 13C provided on the micro-LED 13 thus positioned are successfully connected to the substrate-side connecting portions 14C to be connected thereto. As a result, the micro-LED 13 is less susceptible to connection failure. When the micro-LED 13 is less susceptible to connection failure, the display function of the pixel PX constituted by the micro-LED 13 is less likely to be impaired. As a result, the display quality of the image displayed by the plurality of pixels PX is favorable.

As illustrated in FIGS. 2 to 4, the first positioning portions 16 are provided separately from the LED-side connecting portions 13C. Specifically, the first positioning portions 16 are provided on the surface of the micro-LED chip 13A on the side opposite to the light-emitting face 13B, at a position not superimposed on the LED-side connecting portions 13C. Similarly, as illustrated in FIGS. 2, 3, and 5, the second positioning portions 17 are provided separately from the substrate-side connecting portions 14C. Specifically, the second positioning portions 17 are provided on the mounting region of the micro-LED 13 of the wiring line substrate 14, at a position not superimposed on the substrate-side connecting portions 14C. Thus, compared with a case in which first positioning portions are integrated with the LED-side connecting portions 13C and second positioning portions are integrated with the substrate-side connecting portions 14C, the LED-side connecting portions 13C and the substrate-side connecting portions 14C are less likely to be a constraint in designing the first positioning portions 16 and the second positioning portions 17. Thus, the degree of freedom in the design of the first positioning portions 16 and the second positioning portions 17 is improved, making it possible to optimize the design of the first positioning portions 16 and the second positioning portions 17 with respect to planar shape, size in a plan view, height, arrangement, and the like, independently of the LED-side connecting portions 13C and the substrate-side connecting portions 14C. Accordingly, even when the micro-LED 13 is made smaller and the LED-side connecting portions 13C are made smaller, for example, the positioning function can be sufficiently exhibited, which is preferable.

As illustrated in FIGS. 2 to 4, each of the first positioning portions 16 forms a substantially columnar shape protruding in the Z-axis direction from the surface of the micro-LED chip 13A facing the wiring line substrate 14 toward the wiring line substrate 14. The first positioning portion 16 has a rectangular planar shape and a protruding tip side portion thereof is recessed in a quadrangular pyramid shape. Specifically, a recessed portion 16A that opens toward the wiring line substrate 14 is formed in the protruding tip side portion of the first positioning portion 16. The recessed portion 16A includes a vertex 16A1 at the deepest (lowest) position, and a peripheral surface thereof is constituted by four inclined faces 16A2 connected to the vertex 16A1. Accordingly, the internal space of the recessed portion 16A has a quadrangular pyramid shape. The vertex 16A1 is disposed in a central position of the first positioning portion 16 in a plan view. The four inclined faces 16A2 include two inclined faces 16A2 facing each other in the X-axis direction and two inclined faces 16A2 facing each other in the Y-axis direction.

As illustrated in FIGS. 2, 3 and 5, each of the second positioning portions 17 forms a substantially columnar shape protruding in the Z-axis direction from the surface of the wiring line substrate 14 facing the micro-LED 13 toward the micro-LED 13 side. The second positioning portion 17 has a rectangular planar shape and a protruding tip side portion thereof forms a quadrangular pyramid shape. Of the second positioning portion 17, the protruding tip side portion having a quadrangular pyramid shape constitutes a protruding portion 17A recess-projection-fitted to the recessed portion 16A of the first positioning portion 16. The protruding portion 17A includes one vertex 17A1 positioned at the highest protruding tip and four inclined faces 17A2 connected to the vertex 17A1. The vertex 17A1 is disposed in a central position of the second positioning portion 17 in a plan view. The four inclined faces 17A2 include two inclined faces 17A2 facing each other in the X-axis direction and two inclined faces 17A2 facing each other in the Y-axis direction. Further, a sum of a height dimension of the second positioning portions 17 and a height dimension of the first positioning portions 16 is less than or about the same as a sum of a height dimension of the substrate-side connecting portions 14C and a height dimension of the LED-side connecting portions 13C. This provides a high degree of certainty that the substrate-side connecting portions 14C and the LED-side connecting portions 13C will be connected (bonded) in a state in which the second positioning portions 17 and the first positioning portions 16 are recess-projection-fitted together.

As illustrated in FIGS. 2 to 4, the first positioning portions 16 having such a configuration are disposed closer to the outer end of the micro-LED 13 than the LED-side connecting portions 13C. Thus, compared with a case in which first positioning portions are disposed closer to the center of the micro-LED 13 than the LED-side connecting portions 13C, the positioning accuracy of the micro-LEDs 13 is high. Moreover, the first positioning portions 16 are disposed at respective corner positions of the four corners of the micro-LED 13 having a rectangular planar shape. That is, a total of four first positioning portions 16 are disposed at diagonal positions (two per diagonal) of the micro-LED 13. In this way, the first positioning portions 16 disposed at respective corner positions of the micro-LED 13 having a rectangular planar shape are recess-projection-fitted to the second positioning portions 17, thereby making it possible to improve prevention of rotation of the micro-LED 13 and position the micro-LED 13 with higher positioning accuracy.

As illustrated in FIGS. 1 to 3, four first positioning portions 16 are provided on each of the micro-LEDs 13. Accordingly, four second positioning portions 17 are provided in each mounting region of all micro-LEDs 13 of the wiring line substrate 14. Accordingly, the plurality of second positioning portions 17 provided on the wiring line substrate 14 are configured to be respectively recess-projection-fitted to the first positioning portions 16 provided on all the micro-LEDs 13. In this way, even in a case in which the plurality of micro-LEDs 13 are collectively mounted on the wiring line substrate 14 and displacement of one of the micro-LEDs 13 occurs, the second positioning portions 17 are recess-projection-fitted to the first positioning portions 16 provided on the micro-LED 13, thereby correcting the displacement of the micro-LED 13. As a result, each of the micro-LEDs 13 is less susceptible to connection failure.

The micro-LED mounting substrate 11 and the micro-LED display 10 according to the present embodiment have structures such as described above. Next, a method of manufacturing the micro-LED mounting substrate 11 will be described. The method of manufacturing the micro-LED mounting substrate 11 according to the present embodiment includes a micro-LED manufacturing process of manufacturing the plurality of micro-LEDs 13, a wiring line substrate manufacturing process of manufacturing the wiring line substrate 14, a micro-LED mounting process of mounting the plurality of micro-LEDs 13, a light blocking portion formation process of forming the light blocking portion 15 on the wiring line substrate 14, and a wavelength conversion layer formation process of forming the wavelength conversion layer 12 on each of the light-emitting faces 13B of the plurality of micro-LEDs 13. Among these, the micro-LED manufacturing process, the wiring line substrate manufacturing process, and the micro-LED mounting process are described sequentially in detail below. Note that the light blocking portion formation process may be performed before the micro-LED mounting process, or may be performed after the wavelength conversion layer formation process.

In the micro-LED manufacturing process, a p-type semiconductor layer, an active layer, and an n-type semiconductor layer are sequentially grown on the plate surface of the support substrate 30 composed of sapphire or the like and subsequently etched, thereby forming the plurality of micro-LED chips 13A disposed side by side in a matrix shape in the plate surface of the support substrate 30 (micro-LED chip formation process). Subsequently, the LED-side connecting portions 13C are formed on the surface of each of the plurality of micro-LED chips 13A on the side opposite to the surface in contact with the support substrate 30 (LED connecting portion formation process). As a result, the plurality of micro-LEDs 13 are provided on the support substrate 30, each with the light-emitting face 13B brought into contact with the plate surface of the support substrate 30 and the LED-side connecting portions 13C positioned on the side opposite to the support substrate 30 side. The array of the plurality of micro-LEDs 13 on the support substrate 30 substantially matches the array of the plurality of micro-LEDs 13 on the micro-LED mounting substrate 11. Once the plurality of micro-LEDs 13 are thus installed on the support substrate 30, the first positioning portions 16 are subsequently formed on all the micro-LEDs 13 (first positioning portion formation process).

Figure 6:
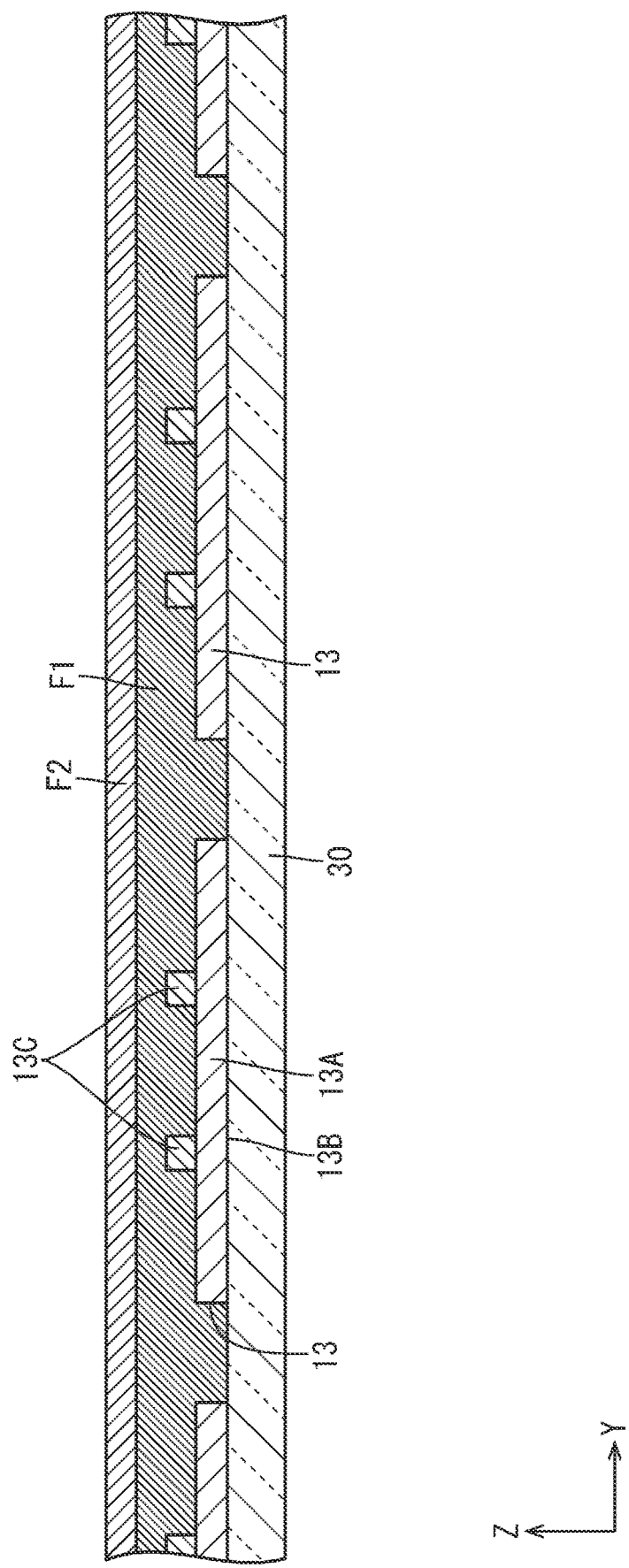
FIG. 6 is a cross-sectional view taken in the Y-axis direction illustrating a state in which a film to be processed and a photoresist film are formed on a support substrate in a micro-LED manufacturing process included in a method of manufacturing a micro-LED mounting substrate.

In the formation of the first positioning portions 16, as illustrated in FIG. 6, on a formation surface of the plurality of micro-LEDs 13 of the support substrate 30, a film F1 to be processed (etched film) is formed by a method such as physical vapor deposition (PVD) or chemical vapor deposition (CVD) and subsequently a photoresist film F2 is formed by a method such as spin coating (film formation process). The film F1 to be processed is a film that constitutes the first positioning portions 16, and is a film processed (etched) via the photoresist film F2 patterned in a post process. The film F1 to be processed is composed of a metal material, a metal compound, an inorganic material (ceramic or the like), an organic material, or the like. The photoresist film F2 is composed of a positive photosensitive material. The film F1 to be processed and the photoresist film F2 are sequentially layered on the installation surface of the LED-side connecting portions 13C of the plurality of micro-LEDs 13.

Figure 7:
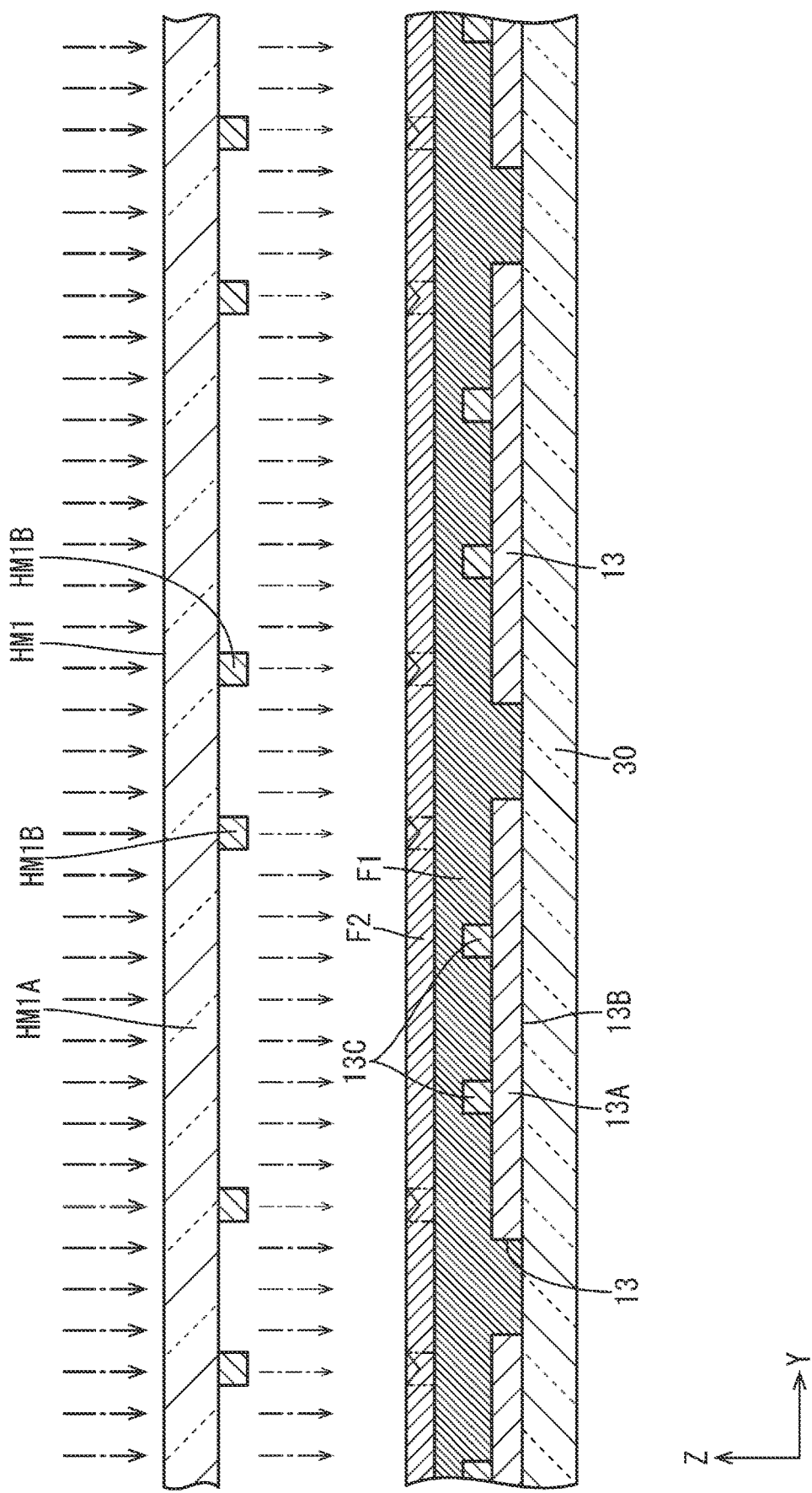
FIG. 7 is a cross-sectional view taken in the Y-axis direction illustrating a state in which the photoresist film is exposed using a half-tone mask in the micro-LED manufacturing process included in the method of manufacturing a micro-LED mounting substrate.

Subsequently, the photoresist film F2 is patterned by a photolithography method (photoresist film patterning process). In the patterning of the photoresist film F2, as illustrated in FIG. 7, the photoresist film F2 is exposed and then developed using a half-tone mask HM1 as a photomask. The half-tone mask HM1 is constituted by a mask substrate HM1A, which is substantially transparent, and a light blocking film HM1B locally provided on one plate surface of the mask substrate HM1A. The half-tone mask HM1 is divided into a transmissive region that transmits light irradiated from an exposure device, a translucent region that transmits light, but where a transmittance of the light is lower than that of the transmissive region, and a light blocking region that blocks light. The light blocking film HM1B is provided in the translucent region and the light blocking region, but is not installed in the transmissive region. Then, the light blocking film HM1B (translucent region and light blocking region) is disposed at a position optically overlapping planned formation positions of each first positioning portion 16 of each of the micro-LEDs 13. Thus, the light transmitted through the transmissive region of the half-tone mask HM1 is not irradiated onto the planned formation positions of the first positioning portions 16. The light blocking film HM1B is disposed with an area ratio of 100% in the light blocking region while disposed with an area ratio lower than 100% in the translucent region. Note that "area ratio" is the ratio of the area of the light blocking film HM1B to each area of the light blocking region or the translucent region. The light blocking film HM1B is configured to vary in light transmittance in the translucent region in accordance with the position in the X-axis direction and the Y-axis direction. Specifically, the light transmittance in the translucent region of the light blocking film HM1B is configured to increase closer to the vertex 16A1 of the recessed portion 16A provided in the first positioning portion 16 in the X-axis direction and the Y-axis direction, and conversely decrease from the vertex 16A1. A portion of the light blocking film HM1B disposed in the light blocking region is disposed in a position optically overlapping the highest portion of the first positioning portion 16, that is, an end portion of each inclined face 16A2 on the side opposite to the vertex 16A1. Note that, in FIG. 7, the illustration of the light blocking film HM1B is simplified.

Figure 8:
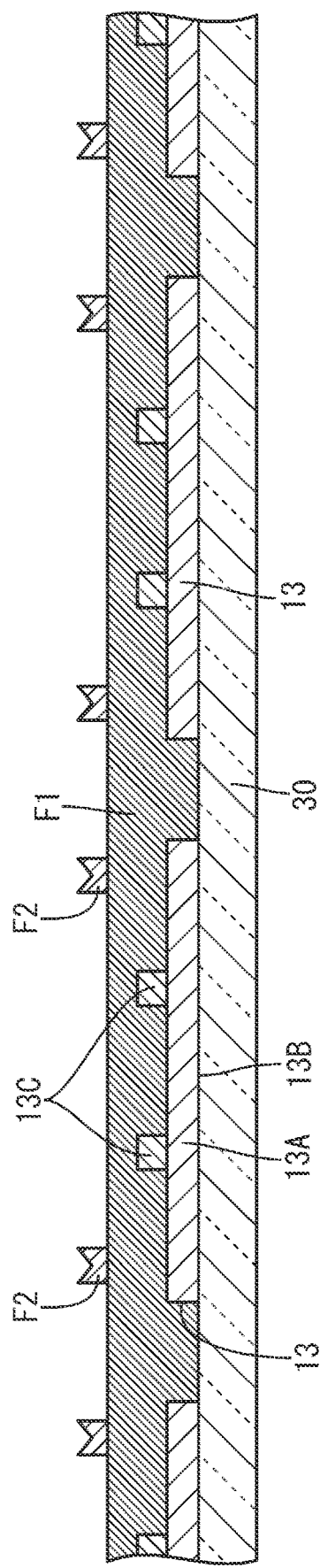
FIG. 8 is a cross-sectional view taken in the Y-axis direction illustrating a state in which the photoresist film is developed in the micro-LED manufacturing process included in the method of manufacturing a micro-LED mounting substrate.

The photoresist film F2 is exposed via the half-tone mask HM1 having a configuration such as described above (exposure process). Then, the portion of the photoresist film F2 that optically overlaps the transmissive region and the translucent region of the half-tone mask HM1 is exposed by an amount of light transmitted by the transmissive region and the translucent region. Subsequently, when the photoresist film F2 is developed, as illustrated in FIG. 8, the portions optically overlapping the transmissive region of the half-tone mask HM1 are completely removed, the portions optically overlapping the light blocking region completely remain, and the portions optically overlapping the translucent region are removed by a thickness amount corresponding to the amount of exposure (development process). In the photoresist film F2 thus patterned, the portions overlapping the planned formation positions of each of the first positioning portions 16 remain, and the cross-sectional shape thereof is similar to the cross-sectional shape of the first positioning portions 16.

Figure 9:
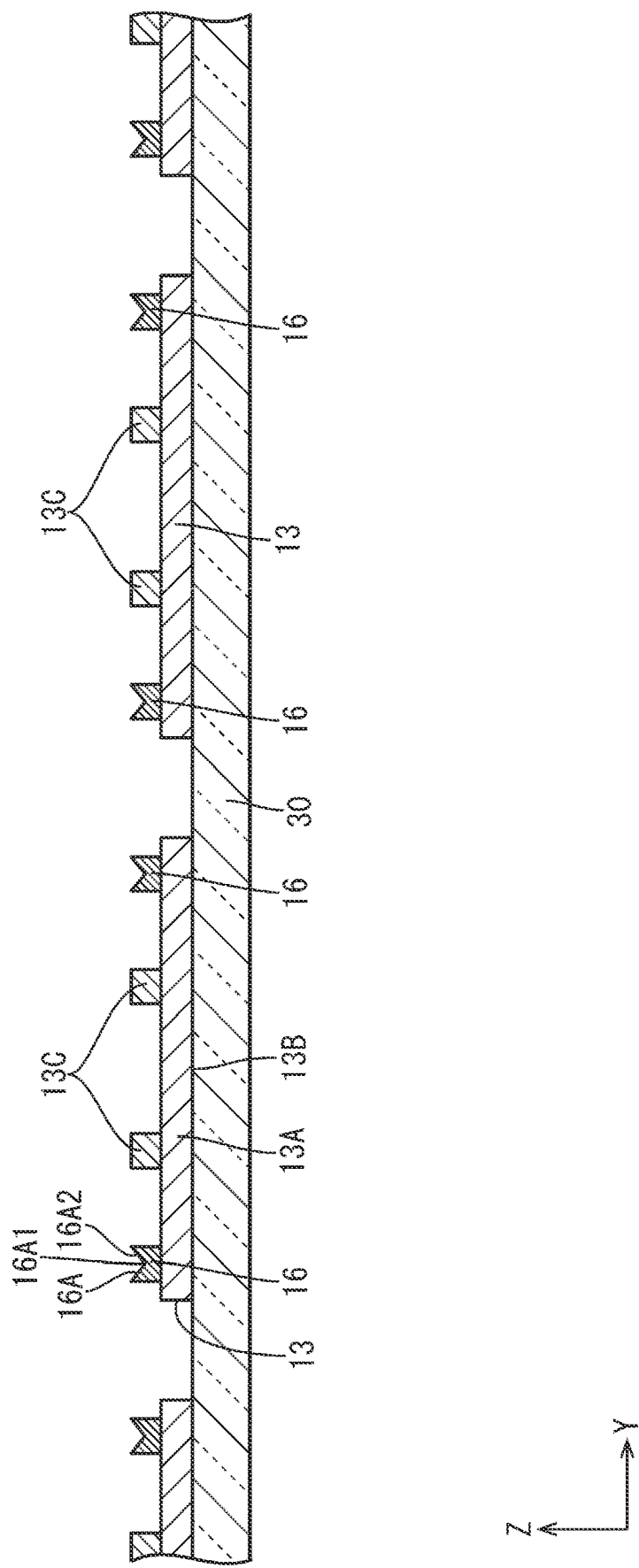
FIG. 9 is a cross-sectional view taken in the Y-axis direction illustrating a state in which the film to be processed is etched to form first positioning portions in the micro-LED manufacturing process included in the method of manufacturing a micro-LED mounting substrate.

Subsequently, dry etching or wet etching is performed on the film F1 to be processed utilizing the remaining portion of the photoresist film F2 as a mask (etching process). Then, as illustrated in FIG. 9, of the film F1 to be processed, the portion not covered by the photoresist film F2 is completely removed while the portion covered by the photoresist film F2 is removed by a thickness amount corresponding to the film thickness of the photoresist film F2. In this way, four first positioning portions 16 are collectively formed on each of the micro-LEDs 13. Subsequently, the photoresist film F2 is removed by ashing (ashing process).

Next, the wiring line substrate manufacturing process will be described. In the wiring line substrate manufacturing process, after the wiring lines 14A, 14B, the substrate-side connecting portions 14C, and the like are formed on the plate surface of the wiring line substrate 14, the second positioning portions 17 are formed (second positioning portion formation process). Note that the second positioning portions 17 may be formed after the substrate-side connecting portions 14C are formed.

Figure 10:
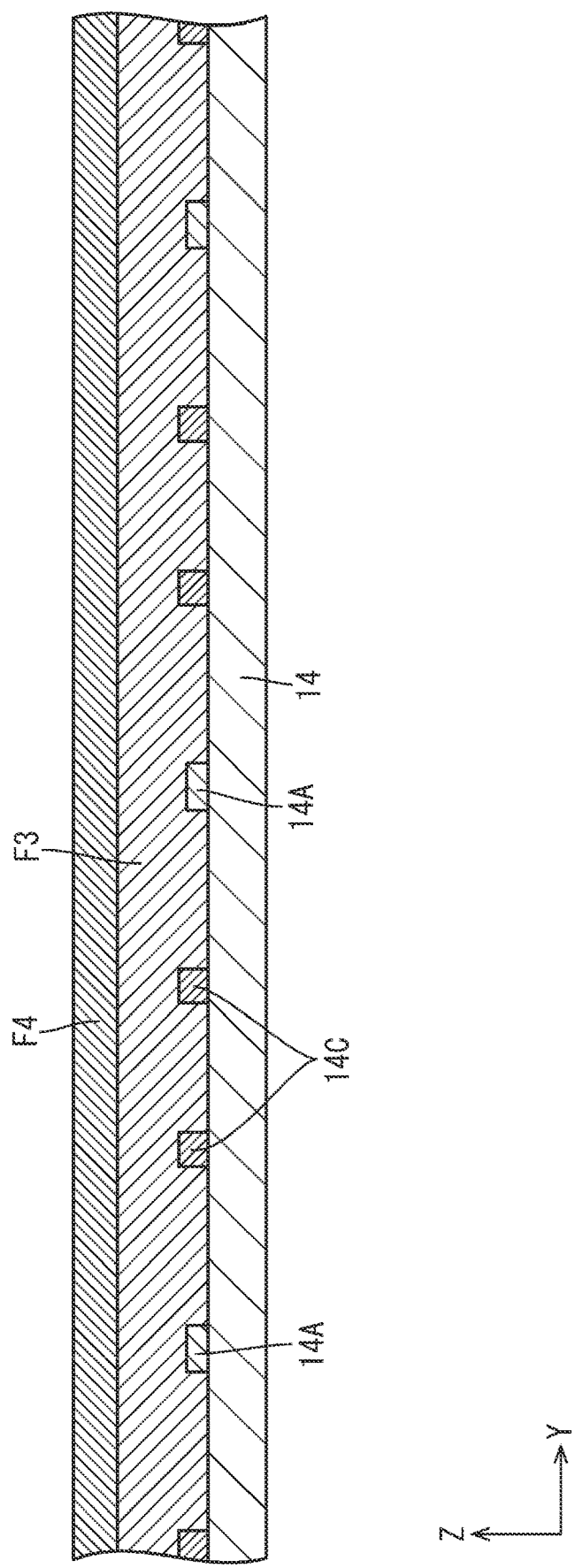
FIG. 10 is a cross-sectional view taken in the Y-axis direction illustrating a state in which the film to be processed and the photoresist film are formed on the wiring line substrate in a wiring line substrate manufacturing process included in the method of manufacturing a micro-LED mounting substrate.

In the formation of the second positioning portions 17, as illustrated in FIG. 10, on the formation surface of each of the wiring lines 14A, 14B and the substrate-side connecting portions 14C of the wiring line substrate 14, a to-be-processed film F3 (to-be-etched film) is formed by a method such as PVD or CVD and subsequently the photoresist film F4 is formed by a method such as a spin coating (film formation process). The to-be-processed film F3 is a film constituting the second positioning portions 17, and is a film processed (etched) via a photoresist film F4 patterned in a post process. The film to be processed F3 is composed of a metal material, a metal compound, an inorganic material (ceramic or the like), an organic material, or the like. The photoresist film F4 is composed of a positive photosensitive material.

Figure 11:
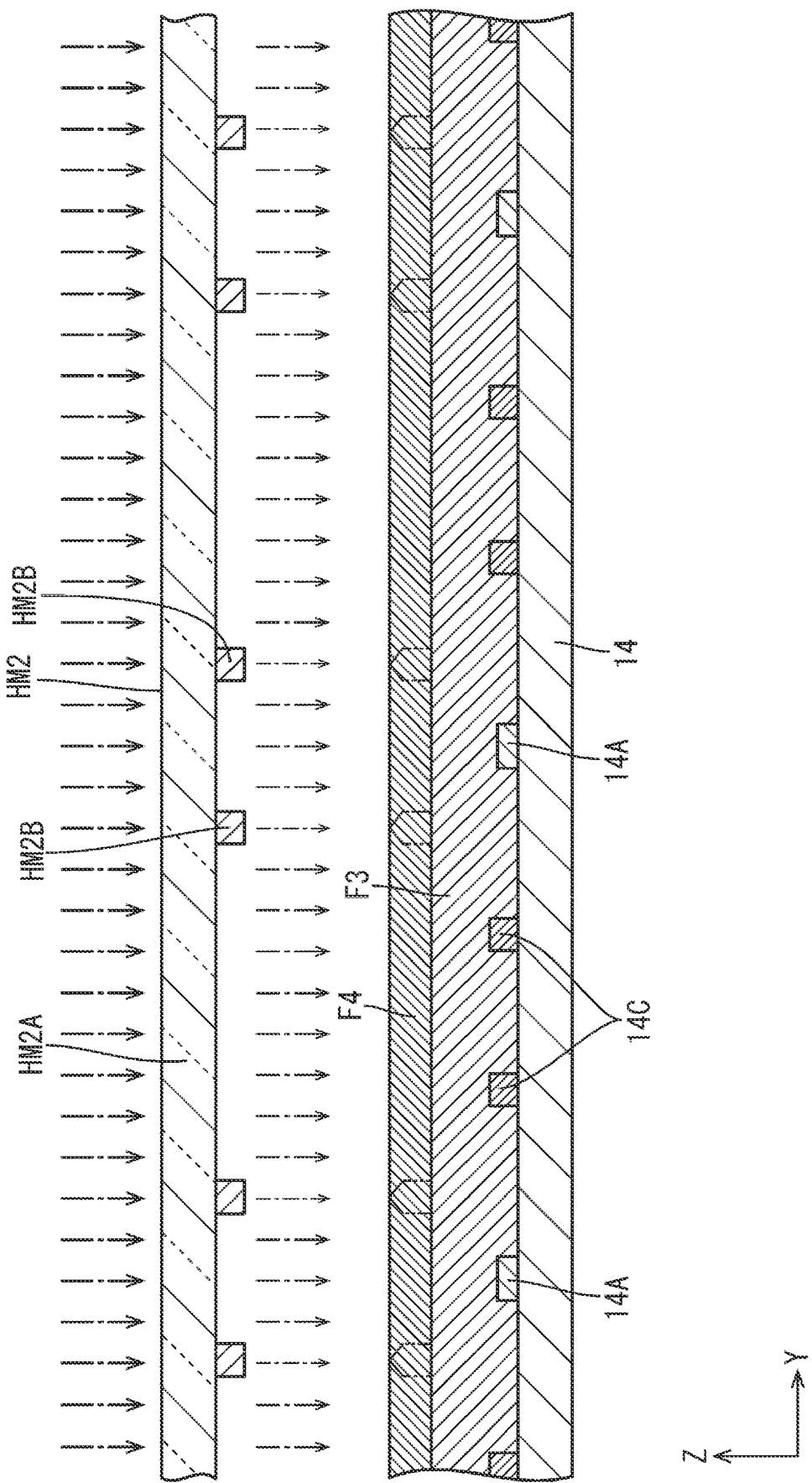
FIG. 11 is a cross-sectional view taken in the Y-axis direction illustrating a state in which the photoresist film is exposed using a half-tone mask in the wiring line substrate manufacturing process included in the method of manufacturing a micro-LED mounting substrate.

Subsequently, the photoresist film F4 is patterned by a photolithography method (photoresist film patterning process). In the patterning of the photoresist film F4, as illustrated in FIG. 11, the photoresist film F4 is exposed and then developed using a half-tone mask HM2 as a photomask. The half-tone mask HM2 includes a mask substrate HM2A, which is a substantially transparent, and a light blocking film HM2B locally provided on one plate surface of the mask substrate HM2A, and is the same as the half-tone mask HM1 described above in terms of including a transmissive region, a translucent region, and a light blocking region. The light blocking film HM2B (translucent region and light blocking region) is disposed in a position optically overlapping planned formation positions of the second positioning portions 17 of the wiring line substrate 14. Thus, the planned formation positions of the second positioning portions 17 are not irradiated with the light transmitted through the transmissive region of the half-tone mask HM2. The light blocking film HM2B is disposed with an area ratio of 100% in the light blocking region while disposed with an area ratio lower than 100% in the translucent region. The light blocking film HM2B is configured to vary in light transmittance in the translucent region in accordance with the position in the X-axis direction and the Y-axis direction. Specifically, the light transmittance in the translucent region of the light blocking film HM2B is configured to decrease closer to the vertex 17A1 of the protruding portion 17A provided on the second positioning portion 17 in the X-axis direction and the Y-axis direction, and conversely increase away from the vertex 17A1. A portion of the light blocking film HM2B disposed in the light blocking region is disposed at the highest portion of the second positioning portion 17, that is, in a position optically overlapping the vertex 17A1. Note that, in FIG. 11, the illustration of the light blocking film HM2B is simplified.

Figure 12:
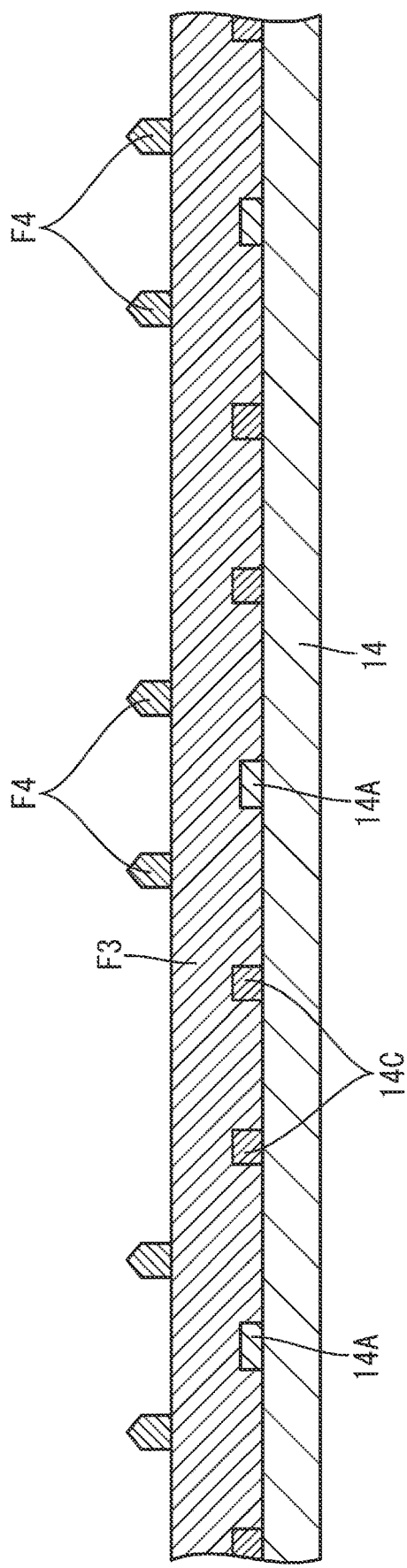
FIG. 12 is a cross-sectional view taken in the Y-axis direction illustrating a state in which the photoresist film is developed in the wiring line substrate manufacturing process included in the method of manufacturing a micro-LED mounting substrate.

The photoresist film F4 is exposed via the half-tone mask HM2 having a configuration such as described above (exposure process). Then, the portions of the photoresist film F4 optically overlapping the transmissive region and the translucent region of the half-tone mask HM2 are exposed to an amount of light transmitted by the transmissive region and the translucent region. Subsequently, when the photoresist film F4 is developed, as illustrated in FIG. 12, the portions optically overlapping the transmissive region of the half-tone mask HM2 are completely removed, the portions optically overlapping the light blocking region completely remain, and the portions optically overlapping the translucent region are removed by a thickness amount corresponding to the amount of exposure (development process). In the photoresist film F4 thus patterned, the portions overlapping the planned formation positions of each of the second positioning portions 17 remain, and a cross-sectional shape thereof is similar to the cross-sectional shape of the second positioning portions 17.

Figure 13:
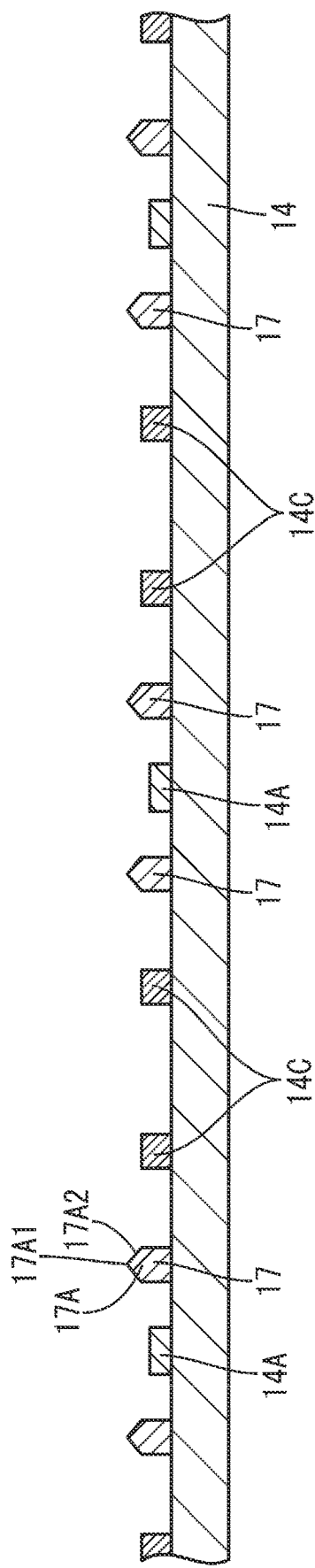
FIG. 13 is a cross-sectional view taken in the Y-axis direction illustrating a state in which the film to be processed is etched to form second positioning portions in the wiring line substrate manufacturing process included in the method of manufacturing a micro-LED mounting substrate.

Subsequently, dry etching or wet etching is performed on the to-be-processed film F3 utilizing the remaining portion of the photoresist film F4 as a mask (etching process). Then, as illustrated in FIG. 13, all the portions of the to-be-processed film F3 not covered by the photoresist film F4 are completely removed while the portions covered by the photoresist film F4 are removed by a thickness amount corresponding to the film thickness of the photoresist film F4. In this way, four second positioning portions 17 are formed on the wiring line substrate 14 at the planned mounting positions of the micro-LEDs 13. Subsequently, the photoresist film F4 is removed by ashing (ashing process).

Figure 15:
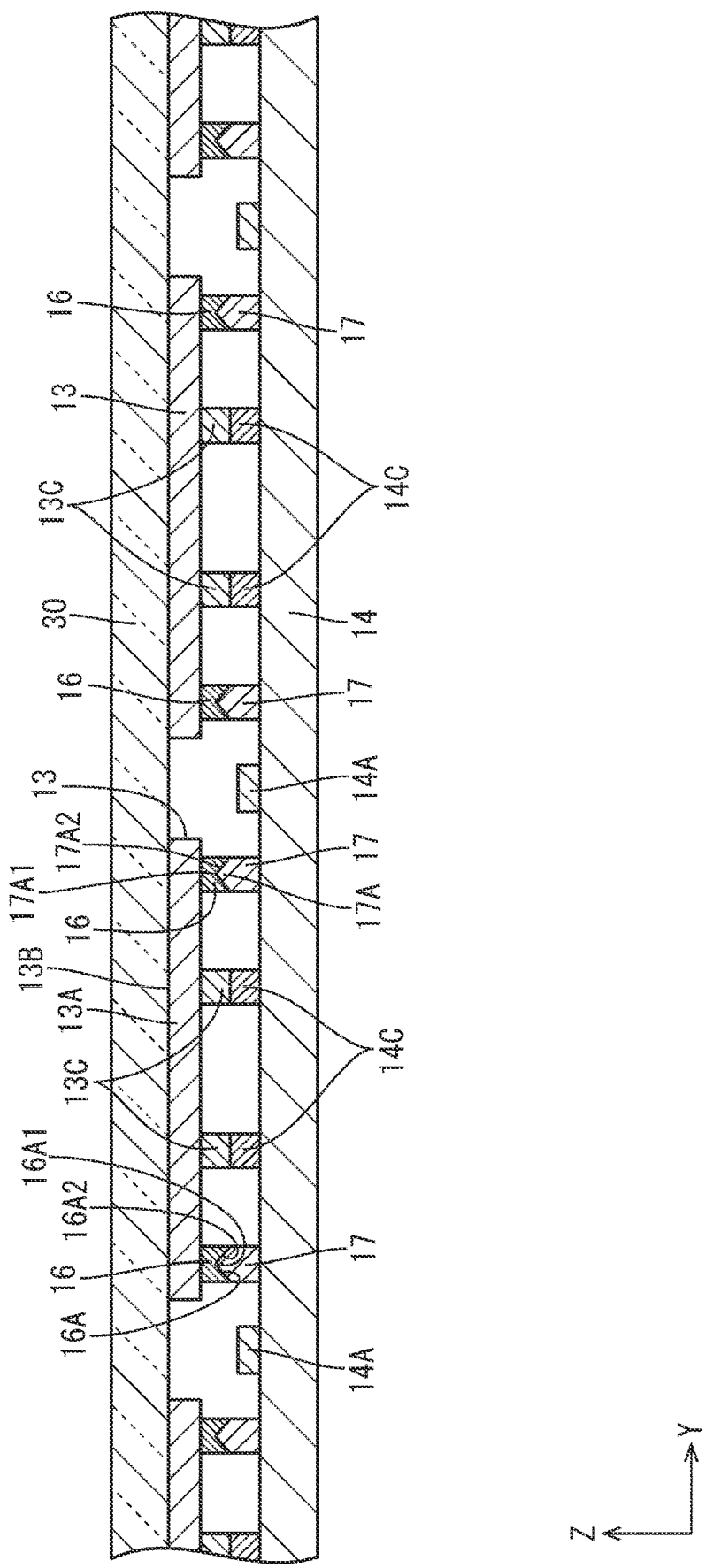
FIG. 15 is a cross-sectional view taken in the Y-axis direction illustrating a state after the support substrate is bonded to the wiring line substrate in the micro-LED mounting process included in the method of manufacturing a micro-LED mounting substrate.

Next, the micro-LED mounting process will be described. In the micro-LED mounting process, as illustrated in FIG. 14, the support substrate 30 on which the plurality of micro-LEDs 13 are formed on the plate surface through the micro-LED manufacturing process is bonded to the wiring line substrate 14 manufactured through the wiring line substrate manufacturing process, and the interface between the support substrate 30 and each of the micro-LEDs 13 is irradiated with laser light. With irradiation by the laser light, each of the micro-LEDs 13 is peeled off from the support substrate 30. Here, as long as displacement does not occur in any of the plurality of micro-LEDs 13 peeled off from the support substrate 30 at the time of bonding, as illustrated in FIG. 15, each substrate-side connecting portion 14C provided on the wiring line substrate 14 is successfully connected (coupled) to a corresponding LED-side connecting portion 13C provided on each of the micro-LEDs 13, and each protruding portion 17A of each second positioning portion 17 provided on the wiring line substrate 14 is recess-projection-fitted to a corresponding recessed portion 16A of a corresponding first positioning portion 16 provided on each of the micro-LEDs 13. As a result, the plurality of micro-LEDs 13 are collectively mounted onto the wiring line substrate 14.

Figure 16:
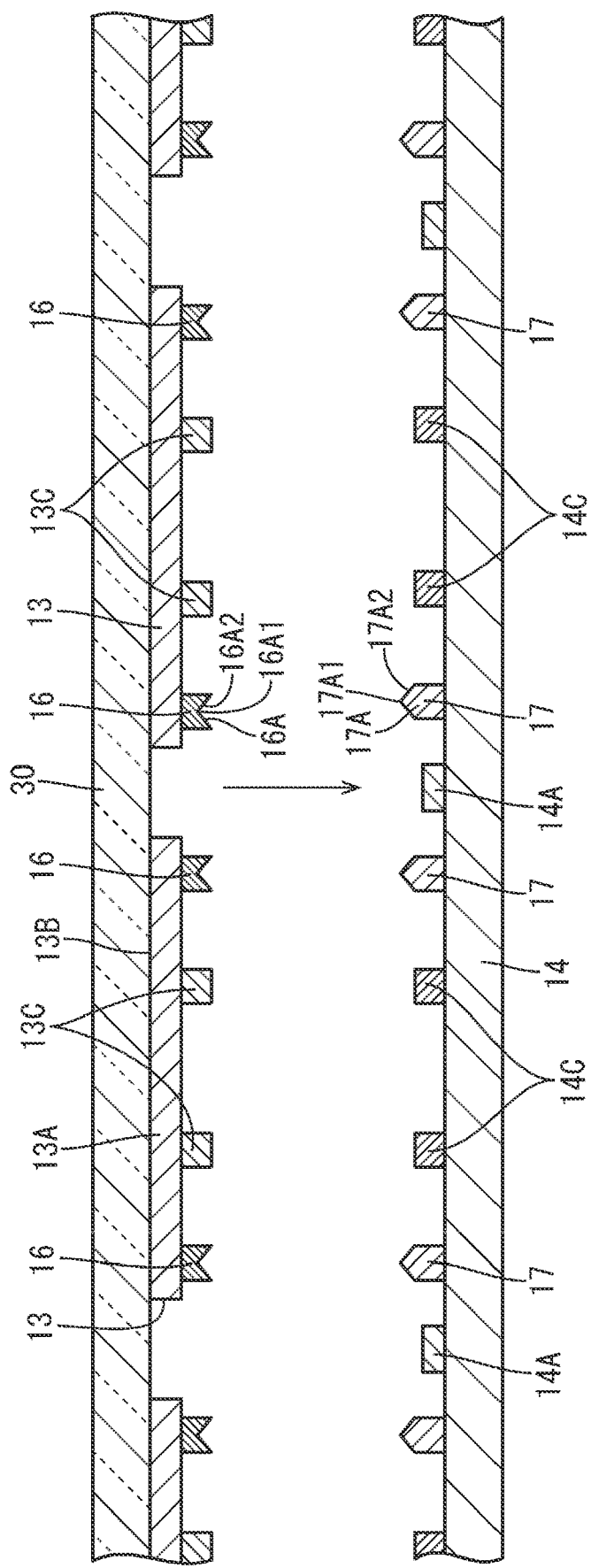
FIG. 16 is a cross-sectional view taken in the Y-axis direction illustrating a state before the support substrate including a displaced micro-LED is bonded to the wiring line substrate in the micro-LED mounting process included in the method of manufacturing a micro-LED mounting substrate.
Figure 17:
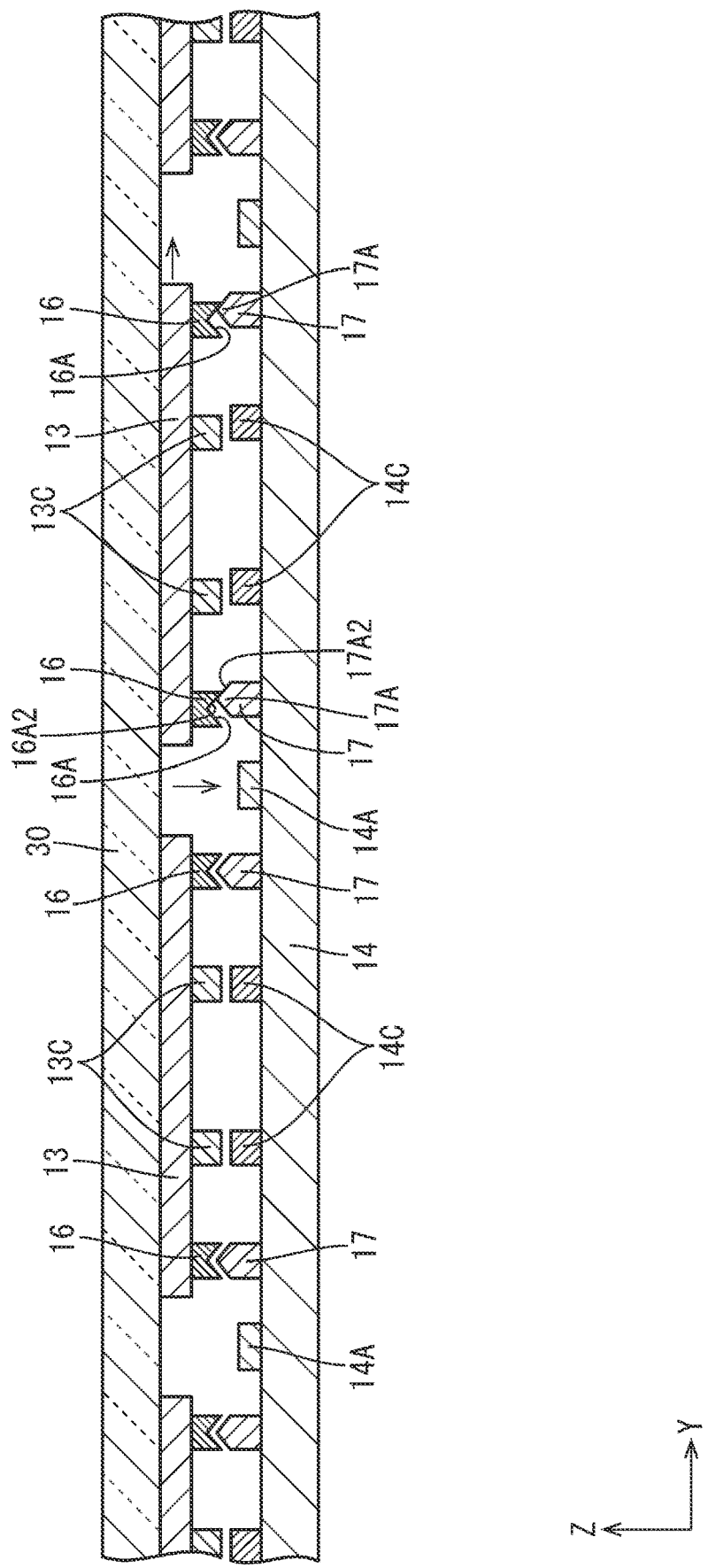
FIG. 17 is a cross-sectional view taken in the Y-axis direction illustrating a state in which the first positioning portion of the displaced micro-LED is brought into contact with the second positioning portion in the micro-LED mounting process included in the method of manufacturing a micro-LED mounting substrate.

On the other hand, displacement may occur in any one of the plurality of micro-LEDs 13 peeled off from the support substrate 30 due to the vibration that occurs in association with bonding and irradiation by the laser light. For example, FIG. 16 illustrates a state in which the micro-LED 13 positioned second from the right in the drawing is displaced to the left side in the drawing. In such a case, as illustrated in FIG. 17, the inclined faces 17A2 of the protruding portions 17A of the second positioning portions 17 that face the inclined faces 16A2 of the recessed portions 16A of the first positioning portions 16 provided on the displaced micro-LEDs 13 are brought into contact with the inclined faces 16A2. When bonding progresses from this state, the inclined faces 16A2 of the recessed portions 16A are brought into sliding contact with the inclined faces 17A2 of the protruding portions 17A, and thus the micro-LED 13 that is displaced is slid into the original position. In this way, the displacement of the micro-LED 13 is corrected and positioning is improved and thus, as illustrated in FIG. 15, all LED-side connecting portions 13C provided on the micro-LEDs 13 are successfully connected to the substrate-side connecting portions 14C. Note that the support substrate 30 is peeled off and removed from the state illustrated in FIG. 15.

As described above, the micro-LED mounting substrate 11 according to the present embodiment includes the wiring line substrate 14 including the pair of plate surfaces (main surfaces) and provided with at least the plurality of substrate-side connecting portions 14C on one plate surface of the pair of plate surfaces, the plurality of micro-LEDs 13 disposed side by side on the one plate surface of the wiring line substrate 14 and each including at least the light-emitting face 13B and the LED-side connecting portions 13C provided on the surface opposite to the light-emitting face 13B and connected to the substrate-side connecting portions 14C, the first positioning portions 16 provided on at least a portion of the plurality of micro-LEDs 13, and facing the installation surface of the substrate-side connecting portions 14C of the wiring line substrate 14, and the second positioning portions 17 provided on the installation surface of the substrate-side connecting portions 14C of the wiring line substrate 14 and capable of positioning the micro-LEDs 13 including the first positioning portions 16 by being recess-projection-fitted to the first positioning portions 16

Thus, when the LED-side connecting portions 13C of the plurality of micro-LEDs 13 disposed side by side in the one plate surface of the wiring line substrate 14 are connected to the substrate-side connecting portions 14C provided on the wiring line substrate 14, light is emitted from each light-emitting face 13B of the plurality of micro-LEDs 13. When the plurality of micro-LEDs 13 are mounted onto the wiring line substrate 14 and displacement of one of the micro-LED 13 occurs, the LED-side connecting portions 13C provided on the micro-LED 13 and the substrate-side connecting portions 14C to be connected thereto may not be successfully connected, causing connection failure to occur in the micro-LED 13.

Therefore, the first positioning portions 16 disposed facing the installation surface of the substrate-side connecting portion 14C of the wiring line substrate 14 are provided on at least a portion of the plurality of micro-LEDs 13 while the second positioning portions 17 recess-projection-fitted to the first positioning portions 16 are provided on the installation surface of the substrate-side connecting portion 14C of the wiring line substrate 14 and thus, even in a case in which, when the plurality of micro-LEDs 13 are mounted on the wiring line substrate 14, one of the micro-LEDs 13 including the first positioning portions 16 is displaced, the displacement of the micro-LED 13 is corrected by the second positioning portions 17 being recess-projection-fitted to the first positioning portions 16 provided on the micro-LED 13. The LED-side connecting portions 13C provided on the micro-LED 13 thus positioned are successfully connected to the substrate-side connecting portions 14C to be connected thereto. As a result, the micro-LED 13 is less susceptible to connection failure.

Further, the first positioning portions 16 are provided separately from the LED-side connecting portions 13C, and the second positioning portions 17 is provided separately from the substrate-side connecting portions 14C. Thus, compared with a case in which first positioning portions are integrated with the LED-side connecting portions 13C and second positioning portions are integrated with the substrate-side connecting portions 14C, the LED-side connecting portions 13C and the substrate-side connecting portions 14C are less likely to be a constraint in designing the first positioning portions 16 and the second positioning portions 17. Thus, the degree of freedom in the design of the first positioning portions 16 and the second positioning portions 17 is improved, making it possible to sufficiently exhibit the positioning function even in a case in which, for example, the micro-LED 13 is made smaller and the LED-side connecting portion 13C is made smaller, which is preferable.

Further, the first positioning portions 16 are disposed closer to the outer end of the micro-LED 13 than the LED-side connecting portions 13C. Thus, compared with a case in which first positioning portions are disposed closer to the center of the micro-LED 13 than the LED-side connecting portions 13C, the positioning accuracy of the micro-LEDs 13 is high.

Further, the micro-LED 13 is a polygon having a planar shape with four or more sides, and at least two of the first positioning portions 16 are disposed at diagonal positions of the micro-LED 13. Thus, the at least two first positioning portions 16 disposed at diagonal positions of the micro-LED 13 having a planar shape with four or more sides are recess-projection-fitted to the second positioning portions 17, thereby making it possible to improve prevention of rotation of the micro-LED 13 and position the micro-LED 13 with higher positioning accuracy.

Further, the first positioning portions 16 are disposed at respective corner positions of the micro-LED 13. Thus, the first positioning portions 16 disposed at respective corner positions of the micro-LED 13 having a planar shape with four or more sides are recess-projection-fitted to the second positioning portions 17, thereby making it possible to position the micro-LED 13 with even higher positioning accuracy.

Further, the first positioning portions 16 are provided on each of the plurality of micro-LEDs 13 while a plurality of the second positioning portions 17 are respectively recess-projection-fitted to the plurality of first positioning portions 16 provided on each of the plurality of micro-LEDs 13. Thus, even in a case in which, in the disposing of the plurality of micro-LEDs 13 side by side in the one plate surface of the wiring line substrate 14, displacement of one of the micro-LEDs 13 occurs, the displacement of the micro-LED 13 is corrected by the second positioning portions 17 being recess-projection-fitted to the first positioning portions 16 provided on the micro-LEDs 13. As a result, each of the micro-LEDs 13 is less susceptible to connection failure.

Further, the micro-LED display 10 according to this embodiment includes the micro-LED mounting substrate 11 described above, and the plurality of pixels PX serving as display units for displaying an image. The plurality of micro-LEDs 13 constitute the plurality of pixels 13. According to the micro-LED display 10 having such a configuration, the micro-LEDs 13 are less susceptible to connection failure, and thus the display function of the pixel PX constituted by the micro-LEDs 13 is less susceptible to damage. As a result, the display quality of the image displayed by the plurality of pixels PX is favorable.

Further, the method of manufacturing the micro-LED mounting substrate 11 according to the present embodiment includes the micro-LED manufacturing process of manufacturing the plurality of micro-LEDs 13 including at least the light-emitting face 13B and the LED-side connecting portions 13C provided on the surface on the side opposite to the light-emitting face 13B, the wiring line substrate manufacturing process of manufacturing the wiring line substrate 14 including the pair of plate surfaces and provided with at least the plurality of substrate-side connecting portions 14C on one plate surface of the pair of plate surfaces, and the micro-LED mounting process of mounting, onto the wiring line substrate 14, the plurality of micro-LEDs 13 side by side in the one plate surface. The micro-LED manufacturing process includes providing the first positioning portions 16 on at least a portion of the plurality of micro-LEDs 13, the first positioning portions 16 facing the installation surface of the substrate-side connecting portions 14C of the wiring line substrate 14, and the wiring line substrate manufacturing process includes providing the second positioning portions 17 on the installation surface of the substrate-side connecting portions 14C of the wiring line substrate 14, the second positioning portions 17 being capable of positioning the micro-LEDs 13 including the first positioning portions 16 by being recess-projection-fitted to the first positioning portions 16.

Thus, in the micro-LED mounting process, the plurality of micro-LEDs 13 manufactured through the micro-LED manufacturing process are mounted side by side in the one plate surface of the wiring line substrate 14 manufactured through the wiring line substrate manufacturing process. As a result, each of the LED-side connecting portions 13C provided on the plurality of micro-LEDs 13 are connected to the substrate-side connecting portions 14C provided on the wiring line substrate 14, and thus light is emitted from each light-emitting face 13B of the plurality of micro-LEDs 13. In the micro-LED mounting process, when displacement of one of the micro-LEDs 13 occurs, the LED-side connecting portions 13C provided on the micro-LED 13 and the substrate-side connecting portions 14C to be connected thereto may not be successfully connected, causing connection failure to occur in the micro-LED 13.

Therefore, in the micro-LED manufacturing process, the first positioning portions 16 facing the installation surface of the substrate-side connecting portions 14C of the wiring line substrate 14 are provided on at least a portion of the plurality of micro-LEDs 13 while, in the wiring line substrate manufacturing process, the second positioning portions 17 to be recess-projection-fitted to the first positioning portions 16 are provided on the installation surface of the substrate-side connecting portions 14C of the wiring line substrate 14 and thus, even in a case in which, in the micro-LED mounting process, one of the micro-LEDs 13 including the first positioning portion 16 is displaced, the displacement of the micro-LED 13 is corrected by the second positioning portions 17 being recess-projection-fitted to the first positioning portions 16 provided on the micro-LED 13. The LED-side connecting portions 13C provided on the micro-LED 13 thus positioned are successfully connected to the substrate-side connecting portions 14C to be connected thereto. As a result, the micro-LED 13 is less susceptible to connection failure.

Further, the micro-LED manufacturing process and the wiring line substrate manufacturing process include providing the first positioning portions 16 and the second positioning portions 17 by a photolithography method using the half-tone masks HM1, HM2, respectively. Thus, the shapes of the first positioning portions 16 and the second positioning portions 17 that can be recess-projection-fitted to each other can be formed with high reproducibility. Accordingly, the configuration is suitable for mass production of the micro-LED mounting substrate 11.

Second Embodiment

A second embodiment will be described with reference to FIG. 18 or 19. In this second embodiment, the number of installations of a first positioning portion 116 and a second positioning portion 117 is changed. Note that redundant descriptions of structures, actions, and effects similar to those of the first embodiment described above will be omitted.

Figure 18:
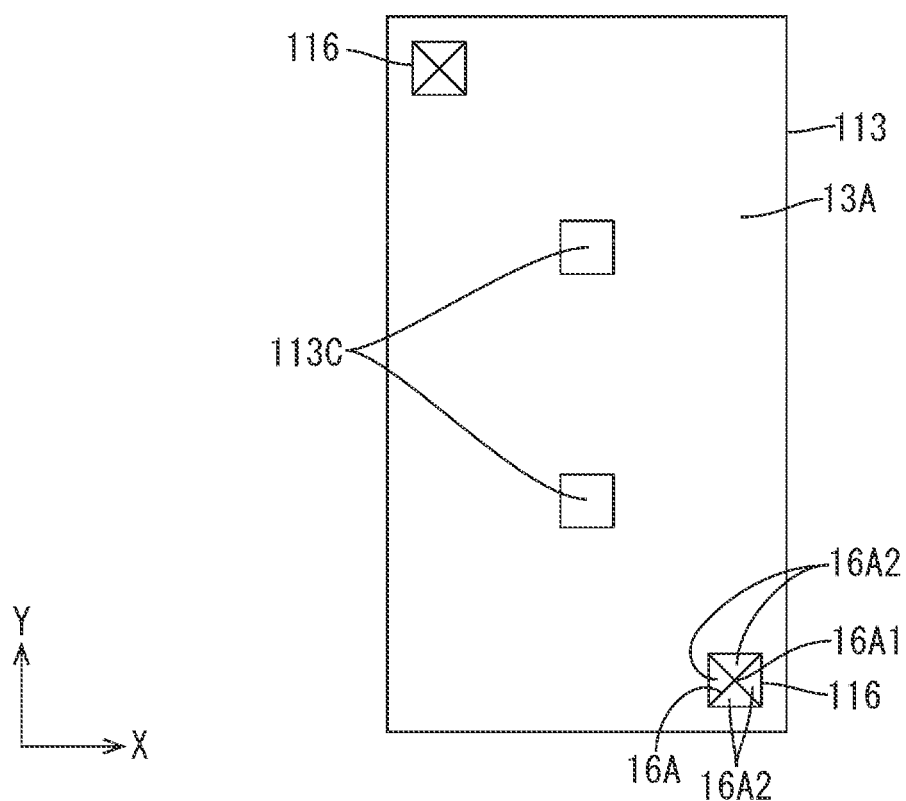
FIG. 18 is a bottom view of a micro-LED according to a second embodiment.
Figure 19:
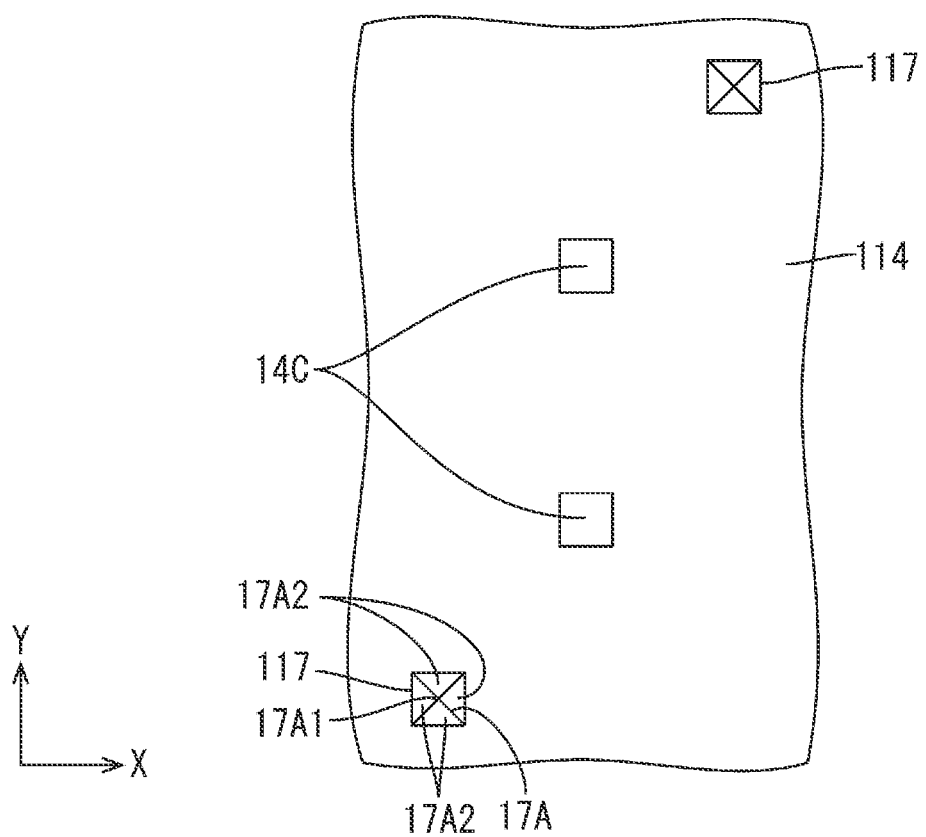
FIG. 19 is a plan view illustrating the mounting region of the micro-LED in the wiring line substrate.

As illustrated in FIG. 18, two first positioning portions 116 according to the present embodiment are disposed at diagonal positions of an installation surface of LED-side connecting portions 113C of a micro-LED 113 having a rectangular planar shape. Accordingly, as illustrated in FIG. 19, two second positioning portions 117 are disposed at diagonal positions of a mounting region of the micro-LED 113 of a wiring line substrate 114. Even in such a configuration, similarly to the first embodiment described above, the micro-LED 113 can be positioned with sufficiently high positioning accuracy.

Third Embodiment

A third embodiment will be described with reference to FIGS. 20 to 22. In this third embodiment, a first positioning portion 216 and a second position portion 217 with a modified number of installations and the like from those in the first embodiment described above will be illustrated Note that redundant descriptions of structures, actions, and effects similar to those of the first embodiment described above will be omitted.

Figure 20:
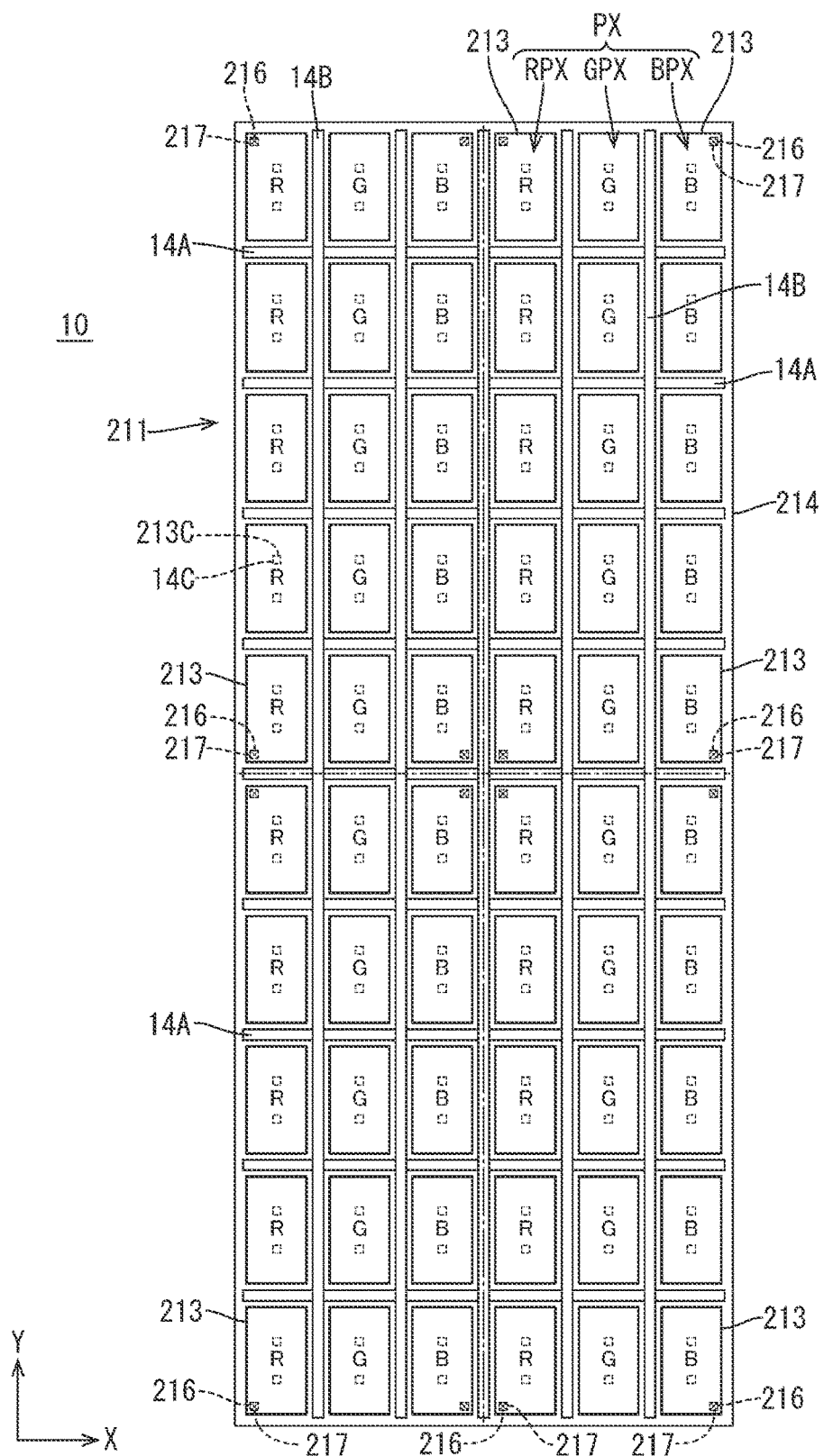
FIG. 20 is a schematic plan view illustrating an array of micro-LEDs in a micro-LED display according to a third embodiment.
Figure 21:
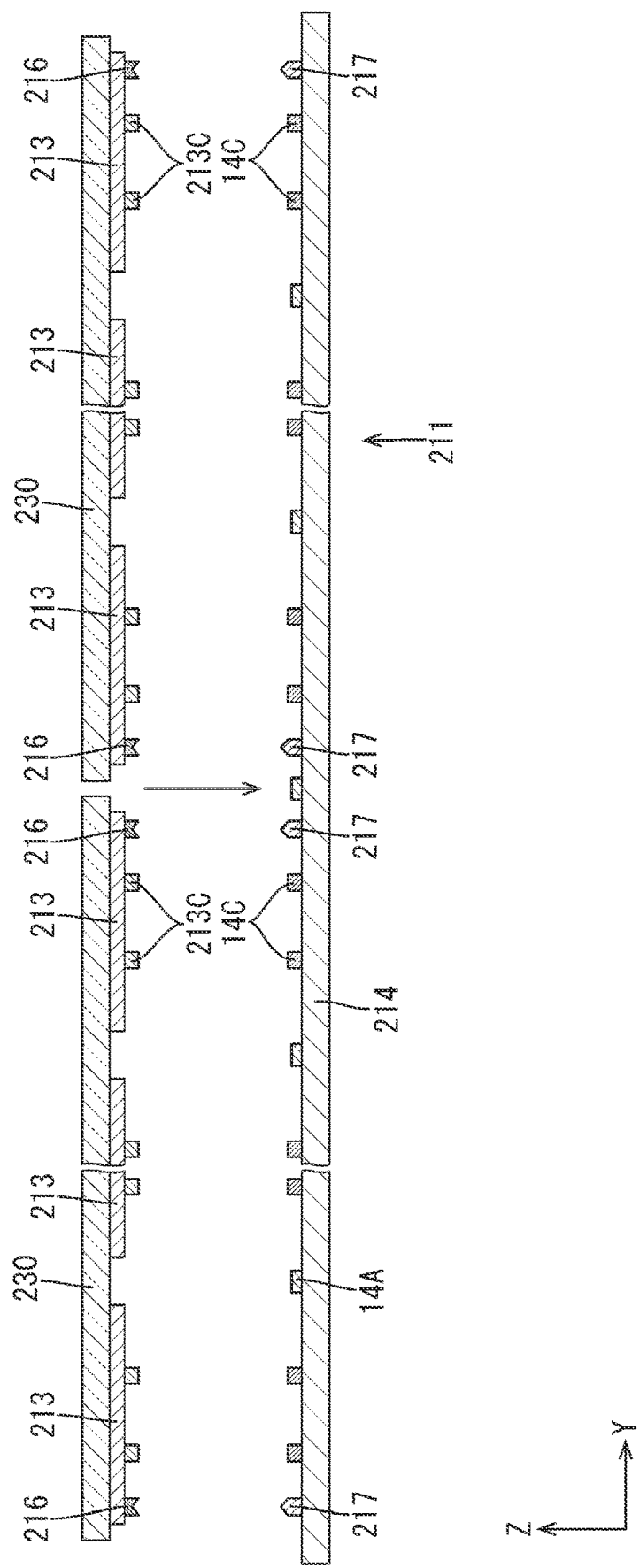
FIG. 21 is a cross-sectional view taken in the Y-axis direction illustrating a state before the support substrate is bonded to the wiring line substrate in the micro-LED mounting process included in the method of manufacturing a micro-LED mounting substrate.
Figure 22:
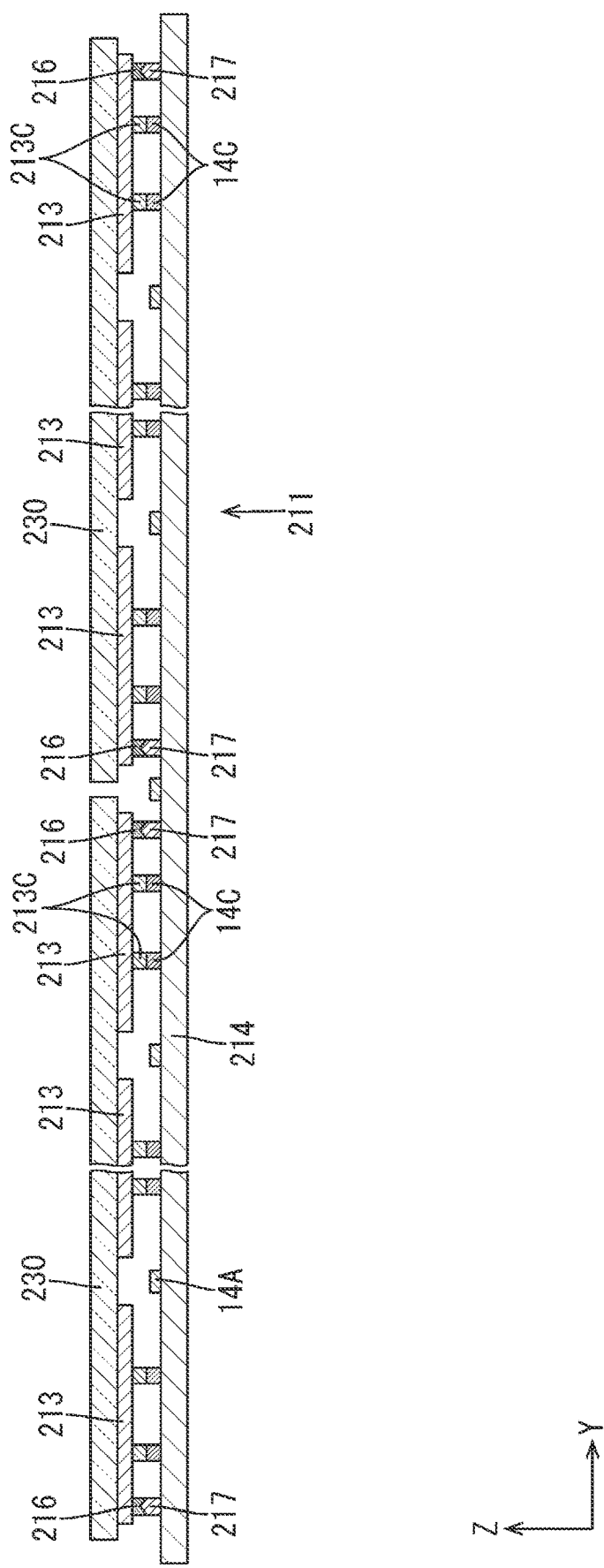
FIG. 22 is a cross-sectional view taken in the Y-axis direction illustrating a state after the support substrate is bonded to the wiring line substrate in the micro-LED mounting process included in the method of manufacturing a micro-LED mounting substrate.

As illustrated in FIGS. 20 and 21, four support substrates 230 are bonded to a wiring line substrate 214 according to the present embodiment, and thus a plurality of micro-LEDs 213 are to be mounted thereto. That is, the plurality of micro-LEDs 213 mounted on the wiring line substrate 214 can be classified into four groups for each support substrate 230. The micro-LEDs 213 belonging to each group are arranged on a plate surface of the wiring line substrate 214, with three arranged side by side in the X-axis direction and five arranged side by side in the Y-axis direction, for a total of 15. Note that, in FIG. 20, boundary lines of the groups (support substrates 230) for the micro-LEDs 213 are illustrated by dot-dash lines.

Then, as illustrated in FIGS. 20 and 21, the first positioning portions 216 are selectively provided on, among the plurality of micro-LEDs 213 belonging to each of the four groups described above, the four micro-LEDs 213 of each group disposed near each corner position of the support substrate 230, and are not installed in the remaining micro-LEDs 213. Specifically, one first positioning portion 216 is provided on each of the four micro-LEDs 213 described above. The four first positioning portions 216 are each disposed at a corner position closest to each corner position of the support substrate 230 of an installation surface of LED-side connecting portions 213C of each of the micro-LEDs 213 to be installed. Note that the first positioning portions 216 are also provided on the four micro-LEDs 213 disposed near the corner positions of the wiring line substrate 214. In contrast, four second positioning portions 217 are provided near the corner positions of the four corners of the four support substrates 230 bonded to the wiring line substrate 214. As described above, the plurality of micro-LEDs 213 disposed side by side in a matrix shape in the plate surface of the wiring line substrate 214 include those in which the first positioning portions 216 are not installed. Thus, such a configuration is suitable in a case in which the micro-LED 213 is made smaller in size, making it difficult to install the first positioning portions 216 on all micro-LEDs 213.

In the micro-LED mounting process included in the method of manufacturing a micro-LED mounting substrate 211, as illustrated in FIG. 21, the four support substrates 230 are each bonded to the wiring line substrate 214, and an interface between the support substrates 230 and the micro-LEDs 213 is irradiated with laser light. At this time, as illustrated in FIG. 22, the first positioning portions 216 selectively provided on each of the micro-LEDs 213 disposed at the corner positions of the support substrate 230 and the wiring line substrate 214 are recess-projection-fitted to the second positioning portions 217. Thus, the positioning of each of the micro-LEDs 213 including the first positioning portion 216 is improved, and the positioning of the support substrate 230 and the wiring line substrate 214 is improved.

As described above, according to the present embodiment, the wiring line substrate 214 is a polygon having a planar shape with four or more sides, the plurality of micro-LEDs 213 are disposed side by side in a matrix shape in the plate surface of the wiring line substrate 214, and the first positioning portion 216 is selectively provided on, among the plurality of micro-LEDs 213, a plurality of micro-LEDs 213 disposed at the corner positions of the wiring line substrate 214. Thus, the plurality of micro-LEDs 213 disposed side by side in a matrix shape in the plate surface of the wiring line substrate 214 include those in which the first positioning portions 216 are not installed. Thus, such a configuration is suitable in a case in which the micro-LED 213 is made smaller in size, making it difficult to install the first positioning portions 216 on all micro-LEDs 213. Further, in a case in which a technique of collectively disposing the plurality of micro-LEDs 213 on the wiring line substrate 214 by supporting the plurality of micro-LEDs 213 on the support substrate 230 in advance and then bonding the support substrate 230 to the wiring line substrate 214 is adopted, the first positioning portions 216 selectively provided on the micro-LEDs 213 disposed at the corner positions of the wiring line substrate 214 are recess-projection-fitted to the second positioning portions 217, thereby making it possible to improve the positioning of these micro-LEDs 213 and improve the positioning of the support substrate 230 and the wiring line substrate 214.

Fourth Embodiment

A fourth embodiment will be described with reference to FIGS. 23 to 25. In this fourth embodiment, the configuration is modified from the first embodiment described above in that a positioning structure is provided on a wiring line substrate 314 and a support substrate 330. Note that redundant descriptions of structures, actions, and effects similar to those of the first embodiment described above will be omitted.

Figure 23:
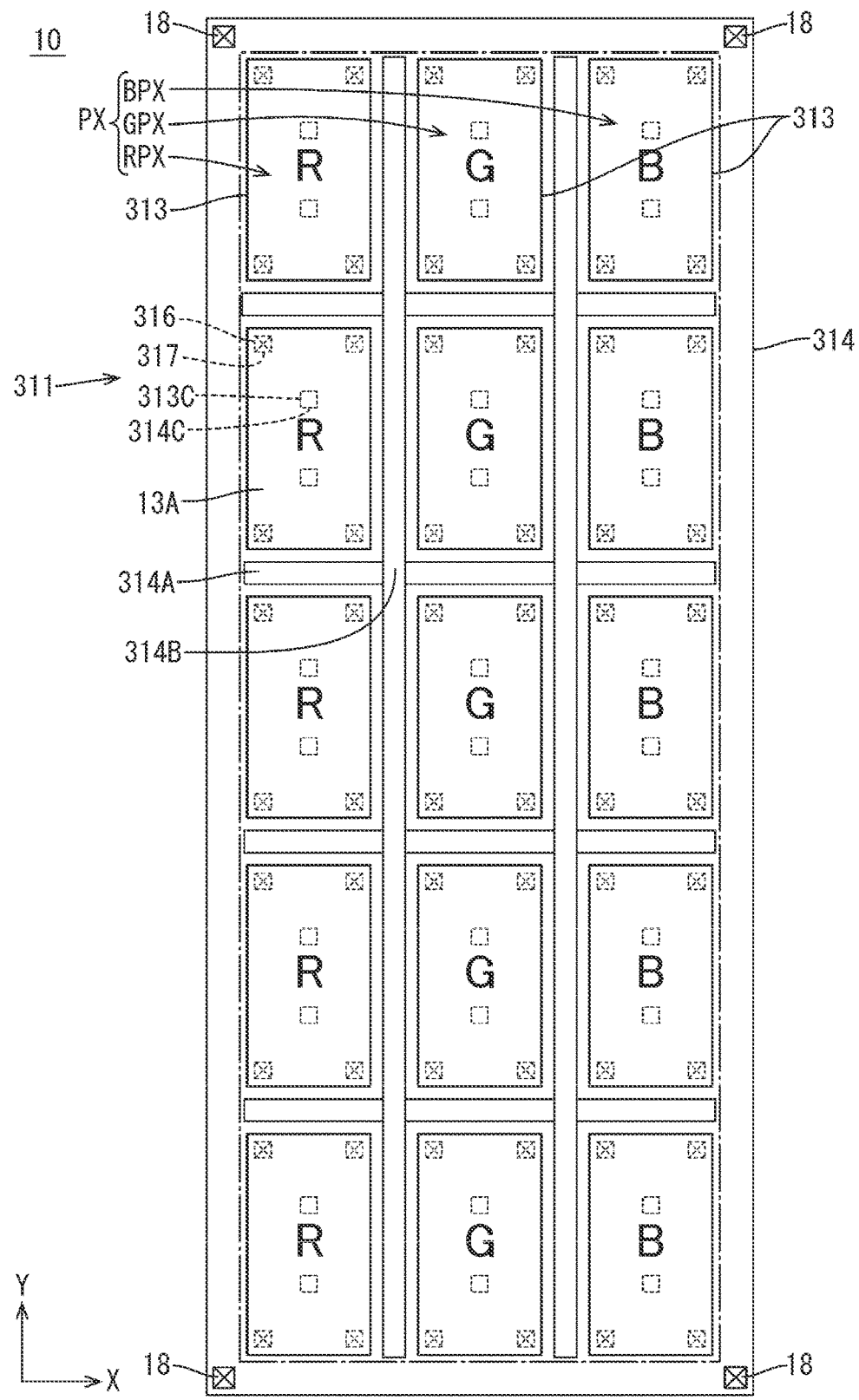
FIG. 23 is a schematic plan view illustrating an array of micro-LEDs in a micro-LED display according to a fourth embodiment.
Figure 24:
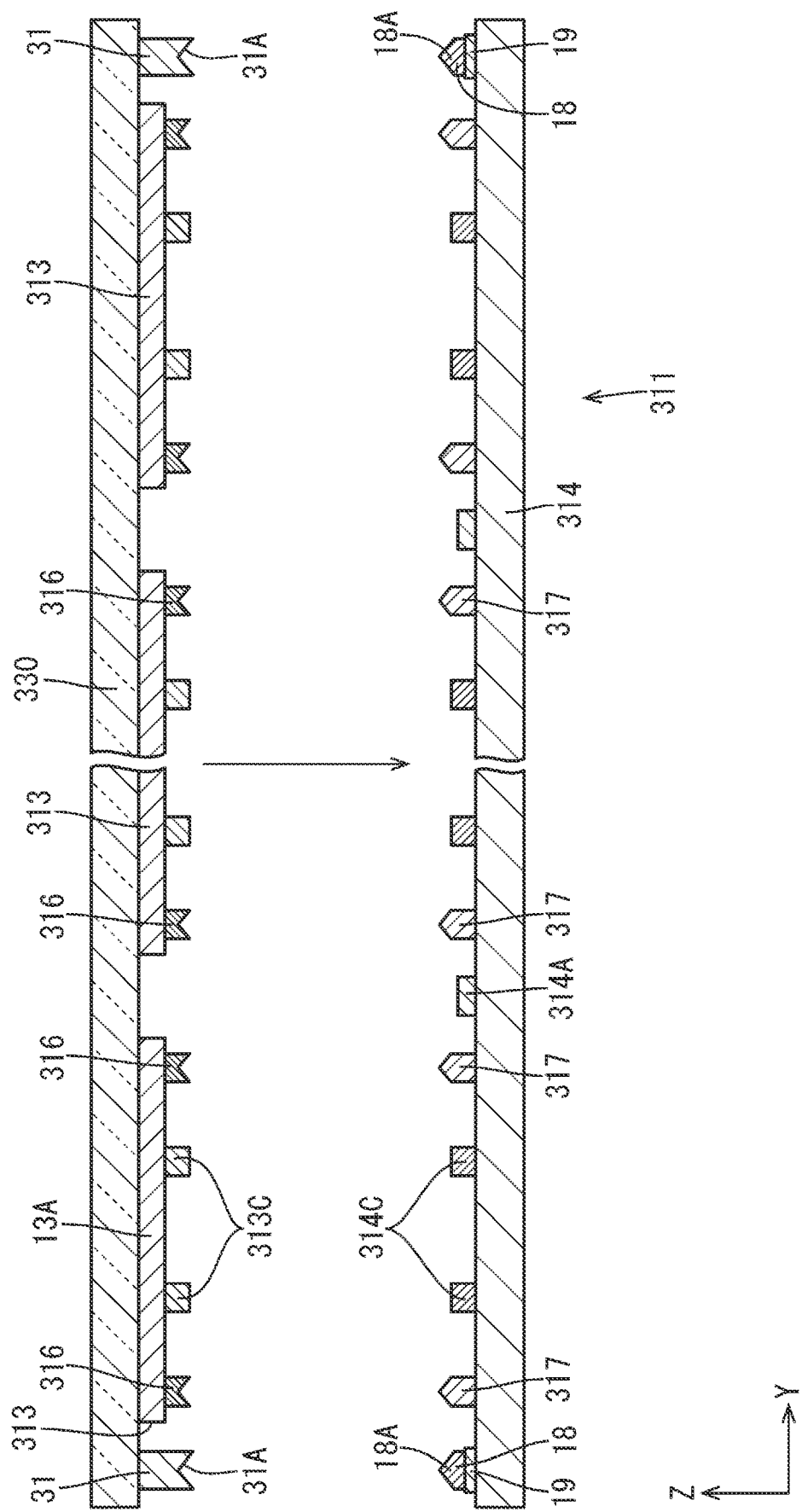
FIG. 24 is a cross-sectional view taken in the Y-axis direction illustrating a state before the support substrate is bonded to the wiring line substrate in the micro-LED mounting process included in the method of manufacturing a micro-LED mounting substrate.

As illustrated in FIGS. 23 and 24, second inter-substrate positioning portions 18 are provided on an installation surface of substrate-side connecting portions 314C of the wiring line substrate 314 according to the present embodiment. Note that FIG. 23 illustrates a display region AA in which each pixel PX is disposed and an image is displayed by a dot-dash line. The second inter-substrate positioning portions 18 are provided at respective corner positions of the four corners of the wiring line substrate 314. Each of the second inter-substrate positioning portions 18, similar to second positioning portions 317, has a rectangular planar shape, and a protruding tip side portion thereof has a quadrangular pyramid shape. Of the second inter-substrate positioning portion 18, the protruding tip side portion having a quadrangular pyramid shape constitutes a protruding portion 18A similar to a protruding portion 317A of the second positioning portion 317. Further, the wiring line substrate 314 is provided with circuit portions 19 connected to micro-LEDs 313 via wiring lines 314A, 314B. The circuit portions 19 can control the drive of each of the micro-LEDs 313 by inputting a signal to each of the wiring lines 314A, 314B. The circuit portions 19 are monolithically formed with respect to the wiring line substrate 314 by the same metal film as that of the wiring lines 314A, 314B, or the like. The circuit portions 19 are disposed at an outer end side portion of the wiring line substrate 314. Note that, in FIG. 23, the circuit portions 19 are not illustrated. Then, the second inter-substrate positioning portions 18 are superimposed on the circuit portions 19. Note that a conductive portion included in the circuit portions 19 is covered by an insulating film, and the insulating film is interposed between the conductive portion and the second inter-substrate positioning portions 18. The second inter-substrate positioning portions 18 having such a configuration are provided on the wiring line substrate 314 in the wiring line substrate manufacturing process included in the method of manufacturing the micro-LED mounting substrate 311.

On the other hand, as illustrated in FIG. 24, the support substrate 330 is provided with first inter-substrate positioning portions 31 capable of being recess-projection-fitted to substrate-side connecting portions 314C. The first inter-substrate positioning portions 31 are provided at respective corner positions of the four corners of the support substrate 330. Each of the first inter-substrate positioning portions 31, similar to first positioning portions 316 provided on the micro-LED 313, has a rectangular planar shape, and a protruding tip side portion thereof is recessed into a quadrangular pyramid shape. Similar to a recessed portion 316A of the first positioning portion 316, a recessed portion 31A that opens toward the wiring line substrate 314 is formed in the protruding tip side portion of the first inter-substrate positioning portion 31. The first inter-substrate positioning portion 31 having such a configuration is provided on the support substrate 330 in the micro-LED manufacturing process included in the method of manufacturing the micro-LED mounting substrate 311.

Figure 25:
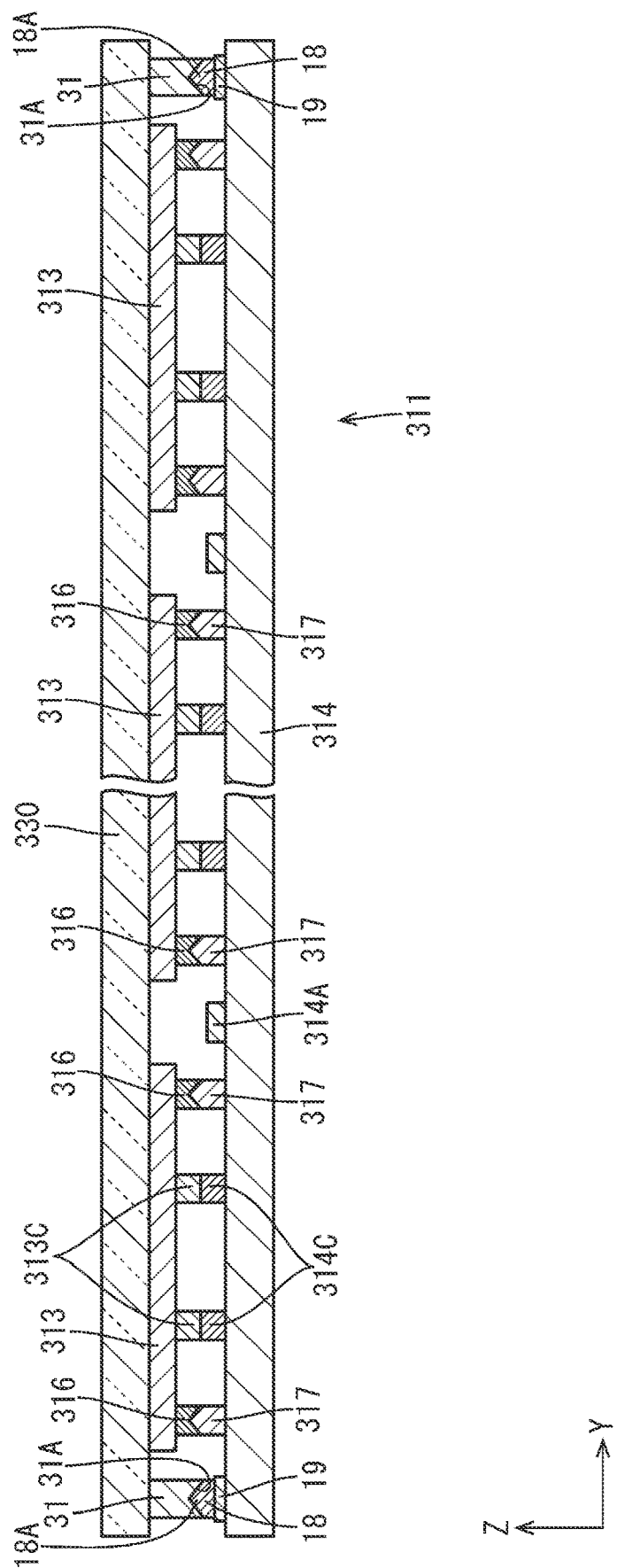
FIG. 25 is a cross-sectional view taken in the Y-axis direction illustrating a state after the support substrate is bonded to the wiring line substrate in the micro-LED mounting process included in the method of manufacturing a micro-LED mounting substrate.

In the micro-LED mounting process included in the method of manufacturing the micro-LED mounting substrate 311, as illustrated in FIGS. 24 and 25, in the bonding of the support substrate 330 to the wiring line substrate 314, the protruding portions 18A of the second inter-substrate positioning portions 18 provided on the wiring line substrate 314 are recess-projection-fitted to the recessed portions 31A of the first inter-substrate positioning portions 31 provided on the support substrate 330. Thus, even in a case in which the support substrate 330 is displaced with respect to the wiring line substrate 314, the displacement of the support substrate 330 is corrected and positioning is improved. The support substrate 330 thus positioned is bonded to the wiring line substrate 314, and thus each of the first positioning portions 316 and corresponding ones of the second positioning portions 317 are recess-projection-fitted together and the LED-side connecting portions 313C provided on the plurality of micro-LEDs 313 are successfully readily connected to the substrate-side connecting portions 314C to be connected thereto.

As described above, according to the present embodiment, the micro-LED manufacturing process includes providing the plurality of micro-LEDs 313 side by side on the one plate surface of the support substrate 330 including the pair of plate surfaces, and providing the first inter-substrate positioning portions 31 on the one plate surface of the support substrate 330, and the wiring line substrate manufacturing process includes providing, on the installation surface of the substrate-side connecting portions 314C in the wiring line substrate 314, the second inter-substrate positioning portions 18 capable of positioning the support substrate 330 to the wiring line substrate 314 by being recess-projection-fitted to the first inter-substrate positioning portions 31. Thus, in the micro-LED mounting process, the support substrate 330 is bonded to the wiring line substrate 314, making it possible to collectively mount the plurality of micro-LEDs 313 on the wiring line substrate 314. Moreover, in the micro-LED mounting process, even in a case in which the support substrate 330 is displaced with respect to the wiring line substrate 314, the displacement of the support substrate 330 is corrected by the second inter-substrate positioning portions 18 being recess-projection-fitted to the first inter-substrate positioning portions 31. The support substrate 330 thus positioned is bonded to the wiring line substrate 314, and thus the LED-side connecting portions 313C provided on the plurality of micro-LEDs 313 are successfully readily connected to the substrate-side connecting portions 314C to be connected thereto.

Further, in the wiring line substrate manufacturing process, the circuit portions 19 connected to the micro-LEDs 313 are provided on the one plate surface (main surface) of the wiring line substrate 314, and the second inter-substrate positioning portions 18 are superimposed on the circuit portions 19. Thus, in comparison to a case in which second inter-substrate positioning portions are not superimposed on the circuit portion 19, a dedicated arrangement space for the second inter-substrate positioning portions 18 need not be established in the wiring line substrate 314. Accordingly, such a configuration is suitable for size reduction of the micro-LED mounting substrate 311.

Fifth Embodiment

A fifth embodiment will be described with reference to FIGS. 26 to 28. In this fifth embodiment, second inter-substrate positioning portions 418 with a configuration modified from that in the fourth embodiment described above will be illustrated. Note that redundant descriptions of structures, actions, and effects similar to those of the first embodiment described above will be omitted.

Figure 26:
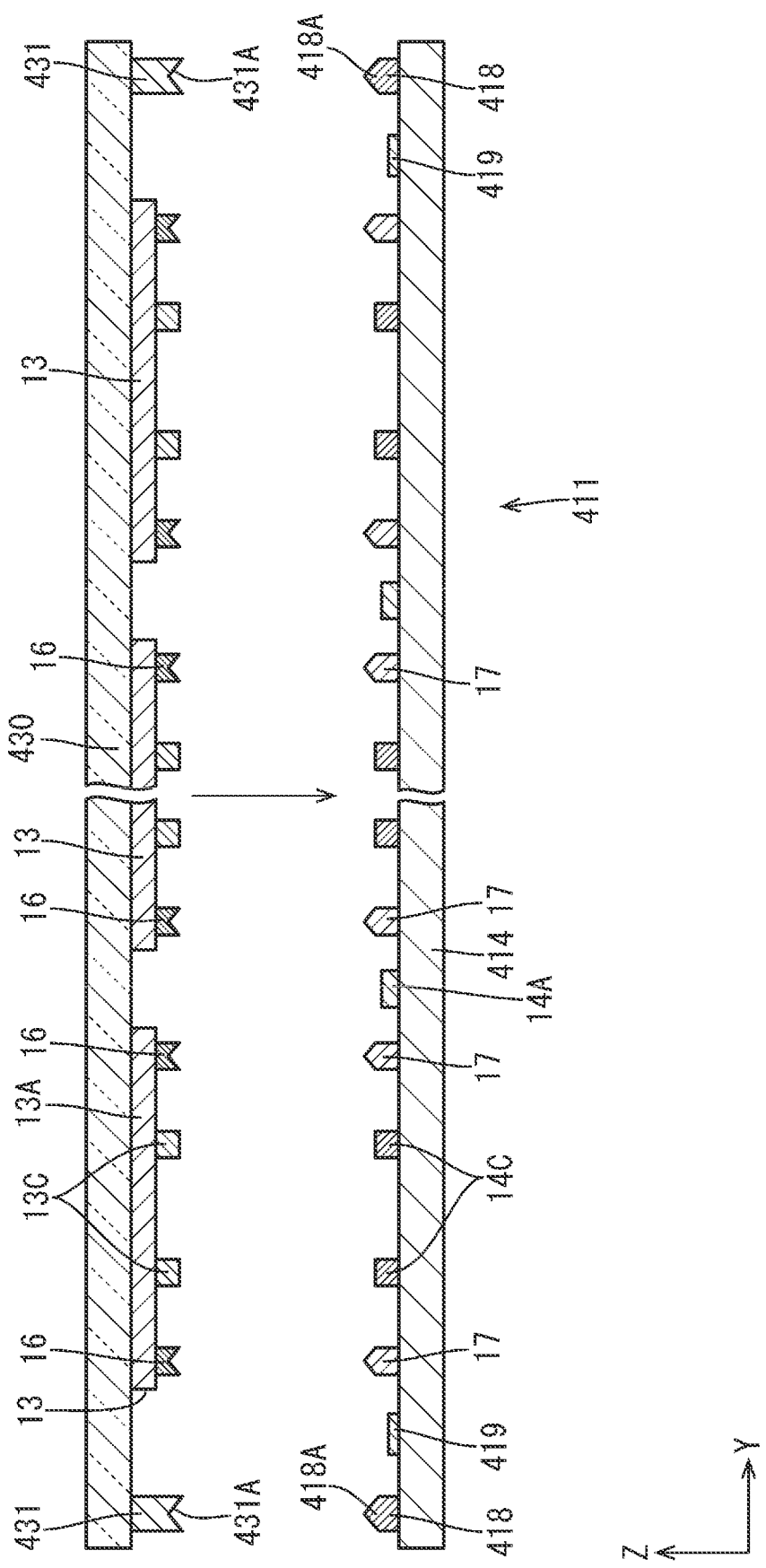
FIG. 26 is a cross-sectional view taken in the Y-axis direction illustrating a state before the support substrate is bonded to the wiring line substrate in the micro-LED mounting process included in the method of manufacturing a micro-LED mounting substrate according to a fifth embodiment.

As illustrated in FIG. 26, second inter-substrate positioning portions 418 according to the present embodiment are disposed at a positions not superimposed on circuit portions 419 in a wiring line substrate 414. Specifically, the second inter-substrate positioning portions 418 are disposed at positions closer to the outer end than the circuit portions 419 in the wiring line substrate 414.

Then, a method of manufacturing a micro-LED mounting substrate 411 according to the present embodiment includes an end portion removal process of parting and removing an end portion 414E of the wiring line substrate 414, the end portion 414E being unnecessary, after the micro-LED mounting process. In the wiring line substrate manufacturing process performed before the micro-LED mounting process, the second inter-substrate positioning portion 418 is provided on the wiring line substrate 414 at the end portion 414E removed in the end portion removal process. At this time, the circuit portions 419 are provided on a portion of the wiring line substrate 414 not removed (portion other than the end portion 414E).

Figure 27:
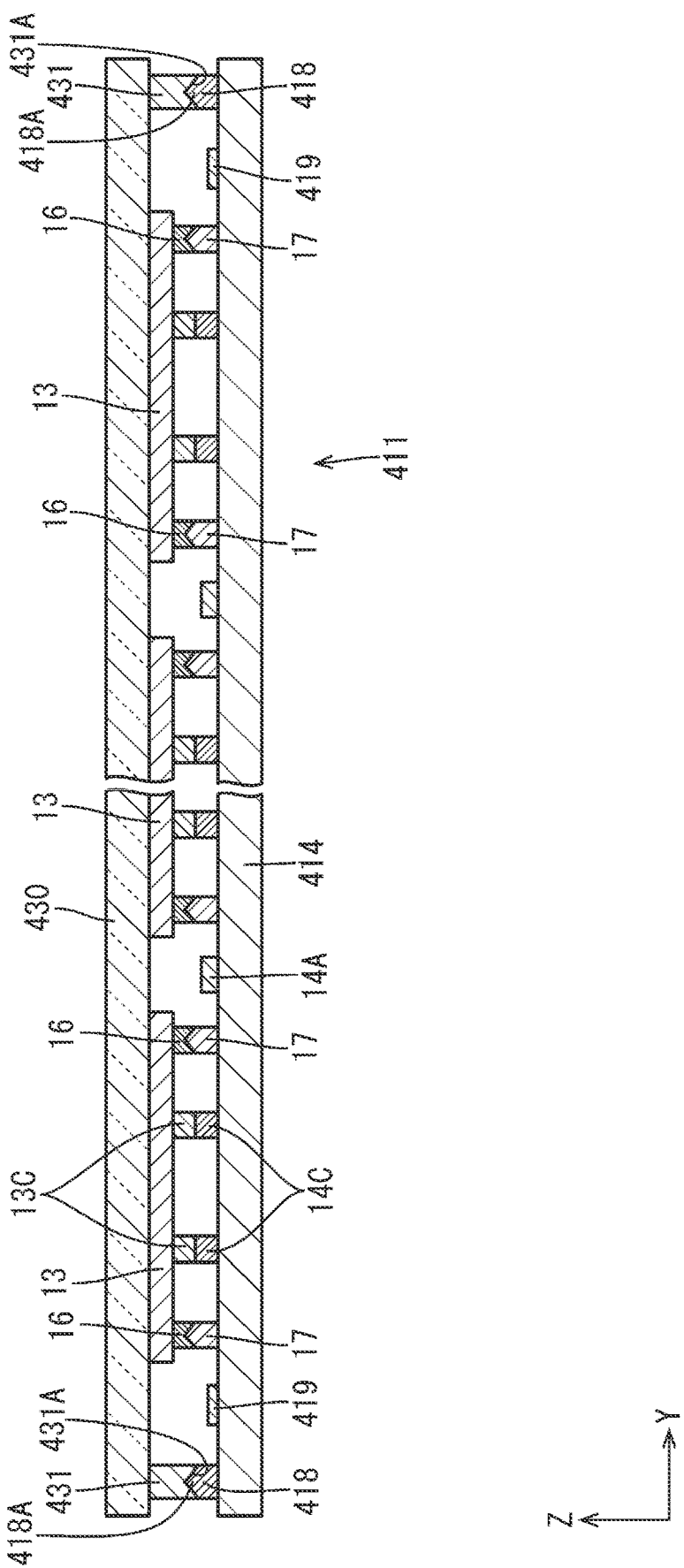
FIG. 27 is a cross-sectional view taken in the Y-axis direction illustrating a state after the support substrate is bonded to the wiring line substrate in the micro-LED mounting process included in the method of manufacturing a micro-LED mounting substrate.

When the micro-LED mounting process is performed, as illustrated in FIGS. 26 and 27, a support substrate 430 is bonded to the wiring line substrate 414. At this time, the protruding portions 418A of the second inter-substrate positioning portions 418 provided on the wiring line substrate 414 are recess-projection-fitted to the recessed portions 431A of the first inter-substrate positioning portions 431 provided on the support substrate 430. Thus, even in a case in which the support substrate 430 is displaced with respect to the wiring line substrate 414, the displacement of the support substrate 430 is corrected and positioning is improved.

Figure 28:
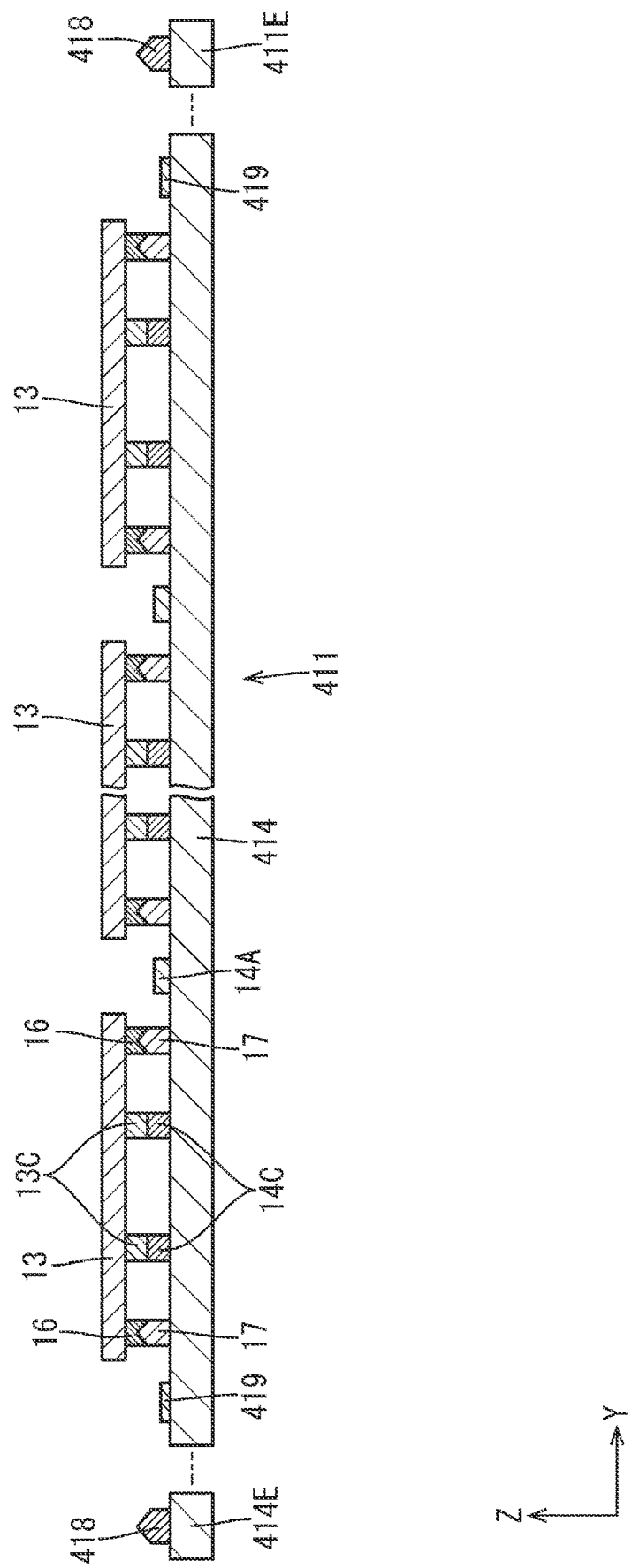
FIG. 28 is a cross-sectional view in the Y-axis direction illustrating a state in which an end portion of the support substrate is removed in an end portion removing process included in the method of manufacturing a micro-LED mounting substrate.

Subsequently, when the end portion removal process is performed after the support substrate 430 is peeled off, the end portion 414E of the wiring line substrate 414 is removed as illustrated in FIG. 28, the end portion 414E being unnecessary. At this time, the second inter-substrate positioning portion 418 provided on the end portion 414E is also removed together with the end portion 414E. The second inter-substrate positioning portion 418 does not remain in the micro-LED mounting substrate 411 manufactured as described above, making the configuration suitable for reducing the size of the micro-LED mounting substrate 411.

As described above, according to the present embodiment, the end portion removal process of parting and removing the end portion 414E of the wiring line substrate 414, the end portion 414E being unnecessary, is included after the micro-LED mounting process, and the wiring line substrate manufacturing process includes providing the second inter-substrate positioning portion 418 on the end portion 414E of the wiring line substrate 414 removed in the end portion removal process. Thus, when the end portion removal process is performed, the second inter-substrate positioning portion 418 is removed together with the unnecessary end portion 414E of the wiring line substrate 414. The second inter-substrate positioning portion 418 does not remain in the manufactured micro-LED mounting substrate 411, making the configuration suitable for reducing the size of the micro-LED mounting substrate 411.

Sixth Embodiment

A sixth embodiment will be described with reference to FIGS. 29 to 32. In this sixth embodiment, first positioning portions 516 and second positioning portions 517 with configurations modified from those in the first embodiment described above will be illustrated. Note that redundant descriptions of structures, actions, and effects similar to those of the first embodiment described above will be omitted.

Figure 29:
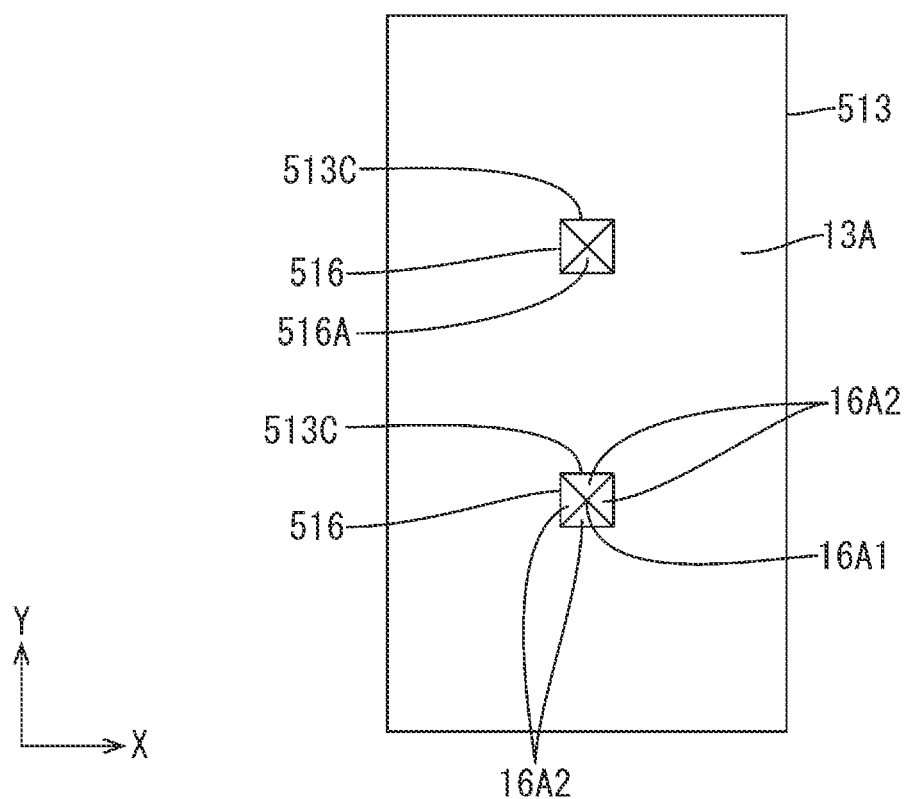
FIG. 29 is a bottom view of a micro-LED according to a sixth embodiment.
Figure 30:
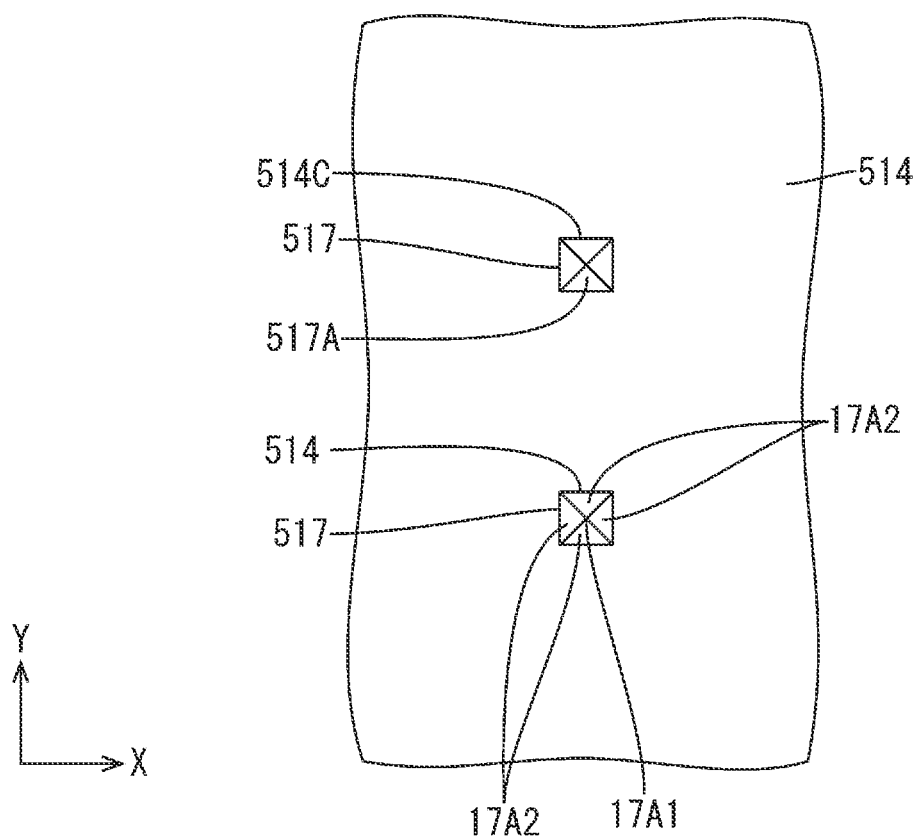
FIG. 30 is a plan view illustrating the mounting region of the micro-LED in the wiring line substrate.
Figure 31:
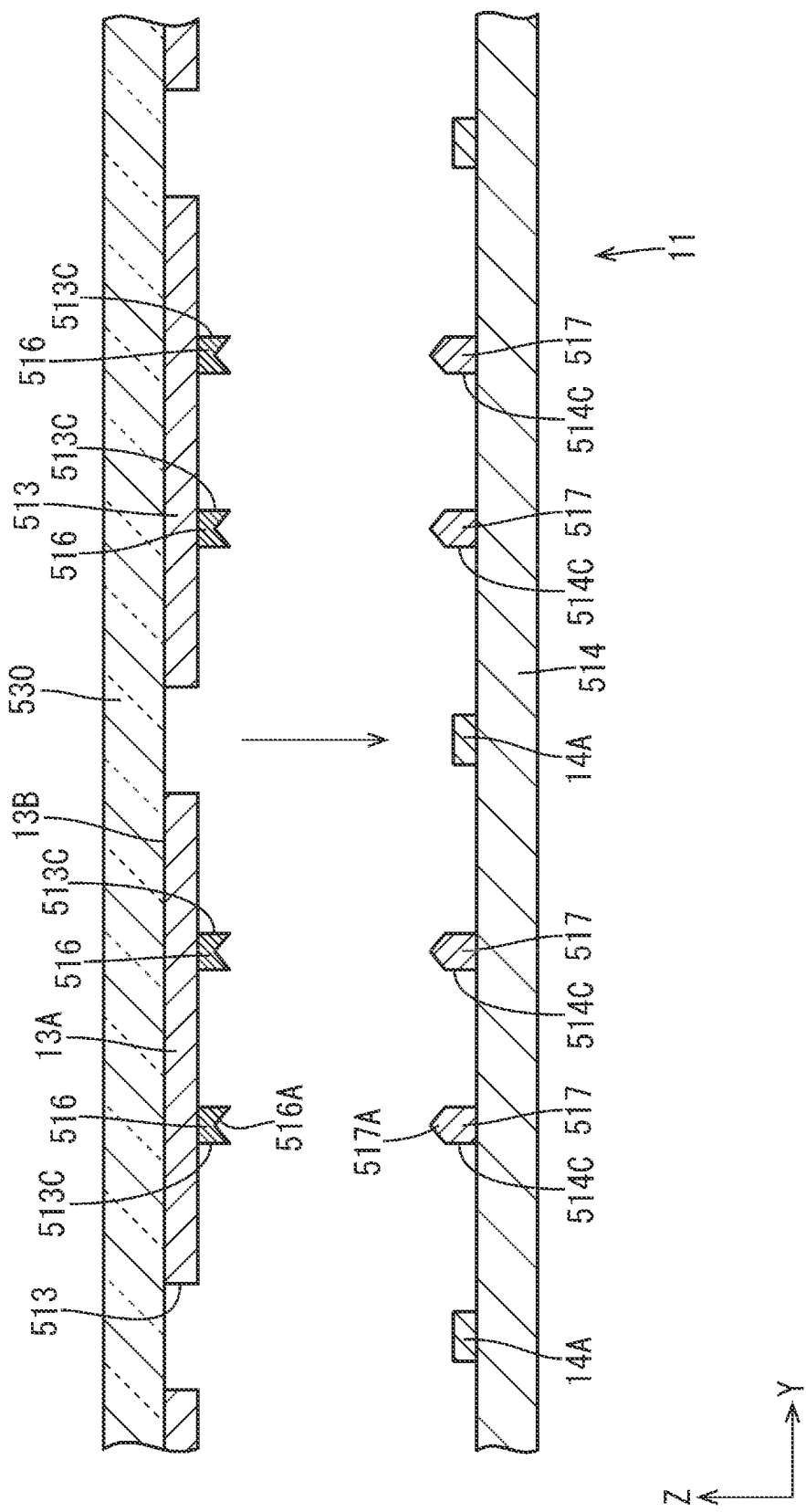
FIG. 31 is a cross-sectional view taken in the Y-axis direction illustrating a state before the support substrate is bonded to the wiring line substrate in the micro-LED mounting process included in the method of manufacturing a micro-LED mounting substrate.

As illustrated in FIGS. 29 to 31, the first positioning portions 516 according to the present embodiment are integrated with LED-side connecting portions 513C. That is, the LED-side connecting portions 513C function as the first positioning portions 516 each including a recessed portion 516A by being given the same shape as that of the first positioning portions 16 (refer to FIG. 2) described in the first embodiment described above. As illustrated in FIGS. 30 and 31, the second positioning portions 517 are integrated with substrate-side connecting portions 514C. That is, the substrate-side connecting portions 514C function as the positioning portions 517 each including a protruding portion 517A by being given the same shape as that of the second positioning portions 17 (refer to FIG. 2) described in the first embodiment described above. Thus, in comparison with a case in which the first positioning portions 16 are provided separately from the LED-side connecting portions 13C and the second positioning portions 17 are provided separately from the substrate-side connecting portions 14C as in the first embodiment described above, a dedicated arrangement space is no longer needed for the first positioning portions 516 and the second positioning portions 517, and the configuration of the micro-LED 513 and the wiring line substrate 514 is simplified.

Figure 32:
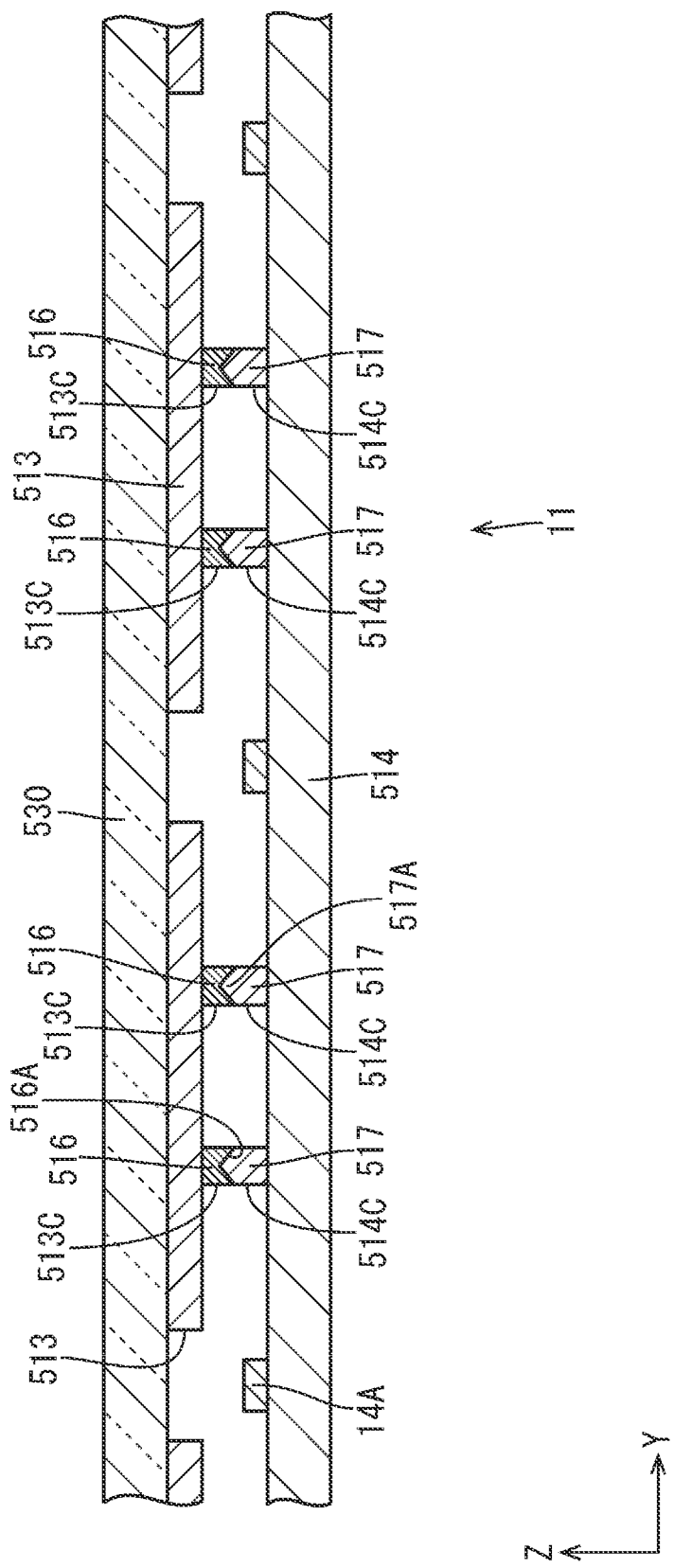
FIG. 32 is a cross-sectional view taken in the Y-axis direction illustrating a state after the support substrate is bonded to the wiring line substrate in the micro-LED mounting process included in the method of manufacturing a micro-LED mounting substrate.

When the micro-LED mounting process is performed, as illustrated in FIGS. 31 and 32, a support substrate 530 is bonded to the wiring line substrate 514. At this time, the substrate-side connecting portions 514C and the protruding portions 517A of the second positioning portions 517 provided on the wiring line substrate 514 are recess-projection-fitted to the LED-side connecting portions 513C and the recessed portions 516A of the first positioning portions 516 provided on the micro-LED 513. Thus, even in a case in which one of the micro-LEDs 513 is displaced, the displacement of the micro-LED 513 is corrected and positioning is improved. In addition, the connection between the LED-side connecting portions 513C and the substrate-side connecting portions 514C is improved.

As described above, according to the present embodiment, the first positioning portions 516 are integrated with the LED-side connecting portions 513C, and the second positioning portions 517 are integrated with the substrate-side connecting portions 514C. Thus, in comparison with a case in which first positioning portions are provided separately from the LED-side connecting portions 513C and second positioning portions are provided separately from the substrate-side connecting portions 514C, a dedicated arrangement space is no longer needed for the first positioning portions 516 and the second positioning portions 517, and the configuration of the micro-LED 513 and the wiring line substrate 514 is simplified.

Seventh Embodiment

A seventh embodiment will be described with reference to FIG. 33. In the seventh embodiment, first positioning portions 616 and second positioning portions 617 with modified configurations from those in the first embodiment described above will be illustrated. Note that redundant descriptions of structures, actions, and effects similar to those of the first embodiment described above will be omitted.

Figure 33:
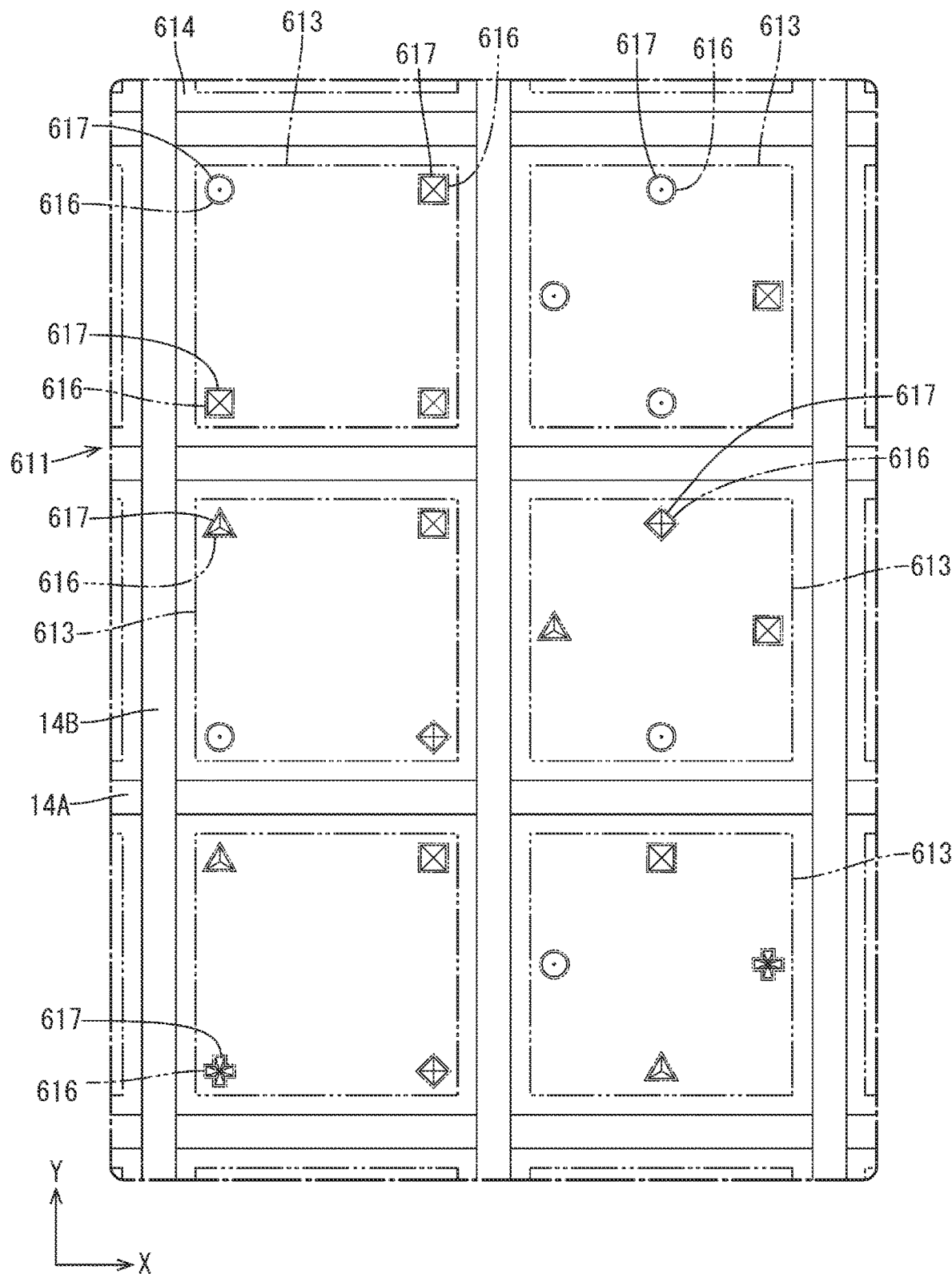
FIG. 33 is a schematic plan view illustrating an array of micro-LEDs in a micro-LED display according to a seventh embodiment.

Four first positioning portions 616 provided on each of the micro-LEDs 613 according to the present embodiment and a plurality of second positioning portions 617 provided on a wiring line substrate 614 each include a plurality of portions having different planar shapes, as illustrated in FIG. 33. Note that, in FIG. 33, the configuration of the micro-LED 613 is illustrated by a two-dot chain line. Specifically, the plurality of first positioning portions 616 and the plurality of second positioning portions 617 include those having a circular planar shape, a quadrangular shape, a triangular shape, a rhomboid shape, and a cross shape. Each of the plurality of types of first positioning portions 616 having different planar shapes forms a cone shape having a vertex at a position where the recessed portion is deepest. Each of the plurality of types of second positioning portions 617 having different planar shapes forms a cone shape having a vertex at a position where the protruding portion is highest.

Then, the plurality of first positioning portions 616 and the plurality of second positioning portions 617 are configured to form a plurality of sets that can be recess-projection-fitted together when a combination of the planar shapes match, but cannot be recess-projection-fitted together when the combination of the planar shapes do not match. For example, the first positioning portion 616 having a circular planar shape can be recess-projection-fitted to the second positioning portion 617 having a circular planar shape, but cannot be recess-projection-fitted to the second positioning portions 617 having a quadrangular planar shape, a triangular planar shape, a rhomboid planar shape, and a cross planar shape. The same applies to each of the first positioning portions 616 having a quadrangular planar shape, a triangular planar shape, a rhomboid planar shape, and a cross planar shape. Moreover, the different sets of the plurality of first positioning portions 616 and the plurality of second positioning portions 617 are each rotationally asymmetric with respect to a center of each of the micro-LEDs 613. For example, focusing on the left-upper micro-LED 613 in FIG. 33, the first positioning portion 616 and the second positioning portion 617 having circular planar shapes are in the left-upper corner position in the drawing, and the first positioning portions 616 and the second positioning portions 617 having quadrangular planar shapes are in the remaining three corner positions. Accordingly, in a case in which this micro-LED 613 is rotated by 90°, 180°, and 270° about its center from the posture illustrated in FIG. 33, in each case, at least one set of the first positioning portions 616 and the second positioning portions 617 can no longer be recess-projection-fitted together. The same applies to the remaining micro-LEDs 613.

In the micro-LED mounting process included in the method of manufacturing a micro-LED mounting substrate 611, displacement may occur in any of the plurality of micro-LEDs 613 peeled from the support substrate due to the vibration that occurs in association with bonding and irradiation by the laser light. Even in such a case, the different sets of the plurality of first positioning portions 616 and the plurality of second positioning portions 617 are each rotationally asymmetric with respect to the center of the micro-LED 613, and thus the combination of any one of the plurality of first positioning portions 616 provided on the displaced micro-LED 613 with any one of second positioning portions 617 provided on the wiring line substrate 614 has a mismatched relationship. Thus, the first positioning portion 616 of a mismatched combination cannot be recess-projection-fitted to the second positioning portion 617, making it possible to prevent the displaced micro-LED 613 from being mistakenly mounted in a form in which the micro-LED 613 rotates about the center thereof. The micro-LED 613 displaced and not mounted on the wiring line substrate 614 falls off the wiring line substrate 614 when the wiring line substrate 614 is turned over after completion of the micro-LED mounting process. Accordingly, in a case in which, in the mass production of the micro-LED mounting substrate 611, the wiring line substrate 614 is turned over and one of the micro-LEDs 613 falls off, it is understood that a displaced micro-LED 613 existed, making it possible to make a repair by remounting the micro-LED 613 in the location of the wiring line substrate 614 where the micro-LED 613 is not mounted.

As described above, according to the present embodiment, the micro-LEDs 613 are provided with a plurality of the first positioning portions 616 while the wiring line substrate 614 is provided with a plurality of the second positioning portions 617, and the plurality of first positioning portions 616 and the plurality of second positioning portions 617 are configured to form a plurality of sets that can fit together when a combination thereof matches and cannot fit together when the combination does not match, and different sets are each rotationally asymmetric with respect to the center of each of the micro-LEDs 613. In the mounting of the micro-LEDs 613 onto the wiring line substrate 614, displacement may occur in a form in which one of the micro-LEDs 613 rotates about the center thereof. Even in such a case, the different sets of the plurality of first positioning portions 616 and the plurality of second positioning portions 617 are each rotationally asymmetric with respect to the center of the micro-LED 613, and thus the combination of any one of the plurality of first positioning portions 616 provided on the displaced micro-LED 613 with any one of second positioning portions 617 provided on the wiring line substrate 614 has a mismatched relationship. Thus, the first positioning portion 616 of a mismatched combination cannot be fitted to the second positioning portion 617, making it possible to prevent the micro-LED 613 that has been displaced from being mistakenly mounted in a form in which the micro-LED 613 rotates about the center thereof.

Other Embodiments

The techniques disclosed in the specification are not limited to the embodiments described above and illustrated by the drawings, and embodiments such as those that will be described below are also included within the technical scope.

(1) The protruding portion may be provided on the first positioning portion 16, 116, 216, 316, 516, 616 side, and the recessed portion may be provided on the second positioning portion 17, 117, 217, 317, 517, 617 side.

(2) The number of installations of the first positioning portions 16, 116, 216, 316, 516, 616 in the micro-LEDs 13, 113, 213, 313, 513, 613 may be one, may be three, or may be five or more.

(3) The shape of the recessed portions 16A, 316A, 516A of the first positioning portions 16, 116, 216, 316, 516, 616 and the shape of the protruding portions 17A, 317A, 517A of the second positioning portions 17, 117, 217, 317, 517, 617 may be changed to a shape other than the cone shape.

(4) The planar shapes of the first positioning portions 16, 116, 216, 316, 516 and the second positioning portions 17, 117, 217, 317, 517 according to the first to sixth embodiments may be changed to any one of the circular shape, the triangular shape, the rhomboid shape, and the cross shape described in the seventh embodiment, and may be changed to a shape other than these (elliptical shape, polygonal shape of five or more sides, star shape, or the like).

(5) The number of types of planar shapes of the first positioning portion 616 and the second positioning portion 617 according to the seventh embodiment may be four or less, or may be six or more.

(6) The first positioning portion 216 described in the third embodiment may be selectively provided on, of the plurality of micro-LEDs 213, the four micro-LEDs 213 disposed near each corner position of the four corners of the wiring line substrate 214, and need not be installed in the remaining micro-LEDs 213.

(7) The recess-projection relationship of the second inter-substrate positioning portions 18, 418 and the first inter-substrate positioning portions 31, 431 according to the fourth and fifth embodiments, and the recess-projection relationship of the first positioning portion 316 and the second positioning portion 317 in relation to the positioning of the micro-LED 313 may be reversed.

(8) In the end portion removal process provided in the method of manufacturing the micro-LED mounting substrate 411 according to the fifth embodiment, the outer peripheral end portion of the wiring line substrate 414 can be partially removed; however, the outer peripheral end portion of the wiring line substrate 414 may be removed across the entire periphery.

(9) The photoresist films F2, F4 used in the micro-LED manufacturing process and the wiring line substrate manufacturing process provided in the method of manufacturing the micro-LED mounting substrates 11, 211, 311, 411, 611 may be composed of a negative photosensitive material.

(10) In the micro-LED manufacturing process and the wiring line substrate manufacturing process provided in the method of manufacturing the micro-LED mounting substrates 11, 211, 311, 411, 611, a gray tone mask including a transmissive region, a translucent region, and a light blocking region similar to that of the half-tone masks HM1, HM2 may be used as the photomask.

(11) The films F1, F3 to be processed used in the micro-LED manufacturing process and the wiring line substrate manufacturing process of the micro-LED mounting substrates 11, 211, 311, 411, 611 may be constituted by a photosensitive material. In this case, the films F1, F3 to be processed can be exposed using the half-tone masks HM1, HM2, making the photoresist films F2, F4 no longer necessary.

(12) In the micro-LED manufacturing process and the wiring line substrate manufacturing process of the micro-LED mounting substrates 11, 211, 311, 411, 611, in the formation of the films F1, F3 to be processed, application by an ink-jet device or a liquid phase deposition method, for example, may be used as a method other than PVD or CVD.

(13) In the micro-LED manufacturing process and the wiring line substrate manufacturing process of the micro-LED mounting substrates 11, 211, 311, 411, 611, the first positioning portions 16, 116, 216, 316, 516, 616 and the second positioning portions 17, 117, 217, 317, 517, 617 may be provided by application by an ink-jet device or by a 3D printer as a method other than a photolithography method.

(14) In the micro-LED manufacturing process and the wiring line substrate manufacturing process provided in the method of manufacturing the micro-LED mounting substrates 11, 211, 311, 411, 611, a baking temperature related to the baking of the photoresist films F2, F4 performed after formation of the films F1, F3 to be processed and the photoresist films F2, F4 may be devised such that the first positioning portions 16, 116, 216, 316, 516, 616 including the recessed portions 16A, 316A, 516A and the second positioning portions 17, 117, 217, 317, 517, 617 including the protruding portions 17A, 317A, 517A are provided without use of the half-tone masks HM1, HM2.

(15) In the micro-LED mounting process provided in the method of manufacturing the micro-LED mounting substrates 11, 211, 311, 411, 611, the number of support substrates 30, 230, 330, 430, 530 bonded to the wiring line substrates 14, 114, 214, 314, 514, 614 may be other than one or four, and may be two, three, or five or more.

(16) In the micro-LED mounting process provided in the method of manufacturing the micro-LED mounting substrates 11, 211, 311, 411, 611, the timing and number of times irradiation of the interface between the support substrates 30, 230, 330, 430, 530 and the micro-LEDs 13, 113, 213, 313, 513, 613 is performed with laser light may be changed as appropriate.

(17) The micro-LEDs 13, 113, 213, 313, 513, 613 may emit near-ultraviolet rays from 200 nm to 380 nm. In this case, the micro-LEDs 13, 113, 213, 313, 513, 613 constituting the blue pixel BPX may be provided with, instead of the non-phosphor layer 12T, a blue phosphor layer that converts the near-ultraviolet rays into blue light.

(18) The first positioning portions 16, 116, 216, 316, 516, 616 may be provided on a side surface of the micro-LEDs 13, 113, 213, 313, 513, 613.

(19) The micro-LED mounting substrates 11, 211, 311, 411, 611 may be used in applications other than the micro-LED display 10 (for example, illumination devices). In that case, all of the micro-LEDs 13, 113, 213, 313, 513, 613 may be configured to emit white light, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A micro-light-emitting diode (micro-LED) mounting substrate comprising:
 a wiring line substrate including a pair of main surfaces, and provided with at least a plurality of substrate-side connecting portions on one main surface of the pair of main surfaces;
 a plurality of micro-LEDs disposed side by side on the one main surface of the wiring line substrate, each of the plurality of micro-LEDs including at least a light-emitting face and an LED-side connecting portion provided on a surface opposite the light-emitting face and electrically connected to a corresponding substrate-side connecting portion in the plurality of substrate-side connecting portions;
 a first positioning portion provided on the surface opposite the light-emitting face of at least one of the plurality of micro-LEDs; and
 a second positioning portion provided on the one main surface of the wiring line substrate and capable of positioning the at least one of the plurality of micro-LEDs including the first positioning portion by being recess-projection-fitted to the first positioning portion,
 wherein the first positioning portion is provided separately from the LED-side connecting portion, and
 the second positioning portion is provided separately from the substrate-side connecting portion.

2. The micro-LED mounting substrate according to claim 1,
 wherein the first positioning portion is disposed closer to an outer end of the at least one of the plurality of micro-LEDs than the LED-side connecting portion.

3. The micro-LED mounting substrate according to claim 2,
 wherein the at least one of the plurality of micro-LEDs is a polygon having a planar shape with four or more sides, and
 at least two of the first positioning portions are disposed at diagonal positions of the at least one of the plurality of micro-LEDs.

4. The micro-LED mounting substrate according to claim 3,
 wherein the first positioning portion is disposed in each corner position of the at least one of the plurality of micro-LEDs.

5. The micro-LED mounting substrate according to claim 1,
 wherein the first positioning portion is provided on each of the plurality of micro-LEDs while a plurality of the second positioning portions is respectively recess-projection-fitted to the plurality of first positioning portions provided on each of the plurality of micro-LEDs.

6. The micro-LED mounting substrate according to claim 1,
 wherein the wiring line substrate is a polygon having a planar shape with four or more sides,
 the plurality of micro-LEDs is disposed side by side in a matrix shape on the one main surface of the wiring line substrate, and
 the first positioning portion is selectively provided on a portion of the plurality of micro-LEDs disposed at corner positions of the wiring line substrate.

7. The micro-LED mounting substrate according to claim 1,
 wherein the plurality of micro-LEDs is provided with a plurality of first positioning portions, including the first positioning portion, while the wiring line substrate is provided with a plurality of second positioning portions, including the second positioning portion, and
 the plurality of first positioning portions and the plurality of second positioning portions are configured to form a plurality of sets that is fittable together when a combination thereof matches and that is not fittable together when the combination does not match, and different sets are each rotationally asymmetric with respect to a center of each of the plurality of micro-LEDs.

8. A micro-LED display comprising:
 the micro-LED mounting substrate according to claim 1; and
 a plurality of pixels serving as display units for displaying an image,
 wherein the plurality of micro-LEDs forms the plurality of pixels.

* * * * *